(12) United States Patent
Henrichs

(10) Patent No.: US 6,792,026 B2
(45) Date of Patent: Sep. 14, 2004

(54) FOLDED CAVITY SOLID-STATE LASER

(76) Inventor: Joseph Reid Henrichs, 641 NE. Swann Cir., Lee's Summit, MO (US) 64086-8464

( * ) Notice: Subject to any disclaimer, the term of this patent is extended or adjusted under 35 U.S.C. 154(b) by 0 days.

(21) Appl. No.: 10/106,726

(22) Filed: Mar. 26, 2002

(65) Prior Publication Data

US 2003/0185266 A1 Oct. 2, 2003

(51) Int. Cl.$^7$ .......................... H01S 3/08; H01S 3/081; H01S 5/00
(52) U.S. Cl. .............. 372/96; 372/93; 372/43
(58) Field of Search .......................... 372/44, 45, 20.9, 372/3, 96, 99, 92

(56) References Cited

U.S. PATENT DOCUMENTS

| | | | | |
|---|---|---|---|---|
| 4,634,928 A | | 1/1987 | Figueroa et al. ............. 315/499 |
| 4,907,241 A | * | 3/1990 | Karube ......................... 372/83 |
| 5,007,065 A | * | 4/1991 | Trutna, Jr. ..................... 372/94 |
| 5,008,718 A | | 4/1991 | Fletcher et al. ............... 357/17 |
| 5,048,035 A | | 9/1991 | Sugawara et al. ............ 372/45 |
| 5,121,404 A | * | 6/1992 | Aoshima et al. .............. 372/75 |
| 5,177,764 A | * | 1/1993 | Nilsson ....................... 372/94 |
| 5,331,654 A | * | 7/1994 | Jewell et al. ................. 372/45 |
| 5,359,209 A | | 10/1994 | Huang ......................... 257/94 |
| 5,481,122 A | | 1/1996 | Jou et al. ....................... 359/9 |
| 5,548,610 A | * | 8/1996 | Bouadma et al. ............. 372/99 |
| 5,903,586 A | * | 5/1999 | Ramdani et al. .............. 372/45 |
| 5,978,398 A | * | 11/1999 | Ramdani et al. .............. 372/45 |
| 6,327,280 B1 | * | 12/2001 | Ducellier et al. ............. 372/20 |
| 6,331,910 B1 | * | 12/2001 | Dultz et al. .................. 359/246 |

OTHER PUBLICATIONS

Huang et al., "Twofold efficiency improvement in high performance AlGaInP light–emitting diodes in the 555–620 nm spectral region using a thick GaP window layer," *Appl. Phys. Lett.*, 61 (9), Aug. 1992, pp. 1045–1047.

Scifres et al., "GaAs/GaAlAs Diode Lasers with Angled Pumping Stripes," *IEEE Journal of Quantum Electronics*, vol. QE–14, No. 4, Apr. 1978.

* cited by examiner

*Primary Examiner*—Don Wong
*Assistant Examiner*—Hung Tran Vy
(74) *Attorney, Agent, or Firm*—Kirkpatrick & Lockhart LLP

(57) ABSTRACT

(FCSSL) "Folded Cavity Solid-State Laser" comprising a waveguide (35) having at least one total internal reflecting prism (35A) constructed from ion-implanted laser-active material defining a folded cavity, wherein augmentation of intra-cavity produced photonic-radiation occurs during its redirection (42A) from a longitudinal propagation (42B) into a transverse propagation (42C) and back into a longitudinal propagation (42E) within the waveguide (35), an active-region (37) defining a gain-medium that provides stimulated-emission of the spontaneous-emission provided by an electrically pumped active-area (37B), a dichroic-mirror (39) providing feedback and the semi-reflected output of photonic radiation that further defines a vertical cavity.

11 Claims, 15 Drawing Sheets

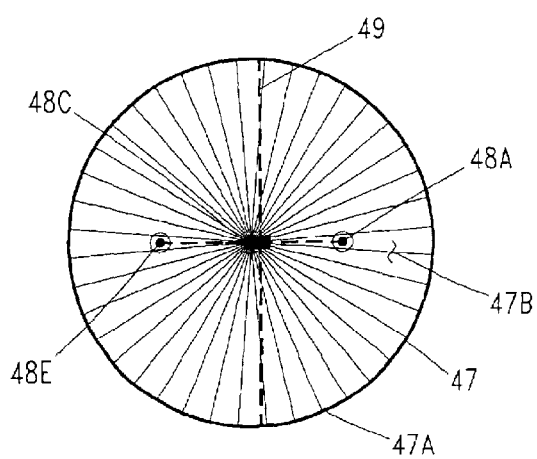
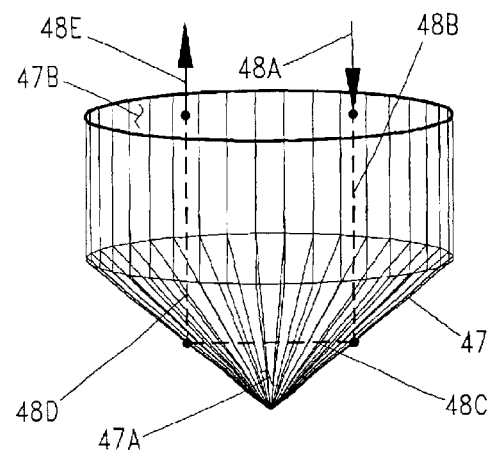
*FIG.16A*  *FIG.16B*
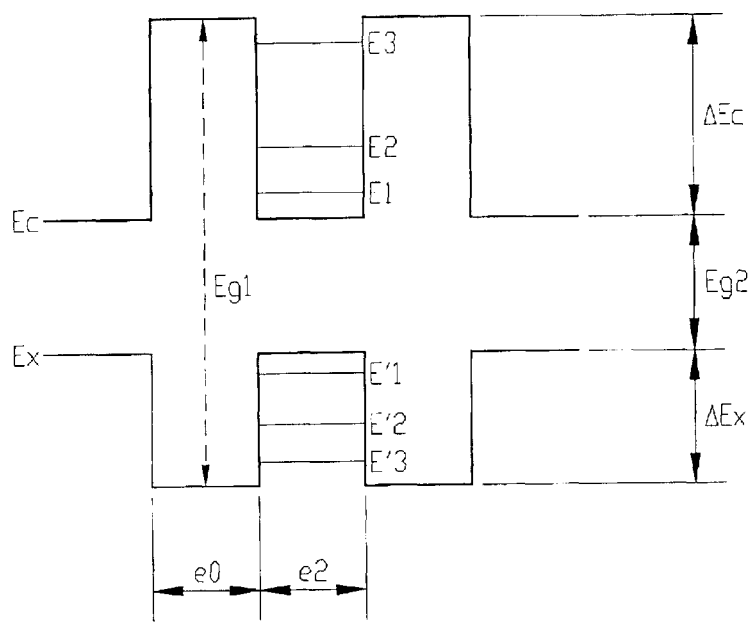
*FIG.17*

FOLDED CAVITY SOLID-STATE LASER

CROSS-REFERENCE TO RELATED APPLICATIONS

This patent application uses, as the preferred embodiment of the polyhedral prism waveguide, the corner-cube prism mirror of my co-pending Non-provisional patent application Ser. No. 09/357,685, which was filed in the U.S. Patent and Trademark Office Jul. 20, 1999.

This patent application uses, as the preferred embodiment of the polyhedral prism waveguide, the corner-cube prism waveguide of my co-pending Nonprovisional patent application Ser. No. 09/765,554, which was filed in the U.S. Patent and Trademark Office Jan. 19, 2000.

This patent application uses, as the preferred embodiment of the polyhedral prism waveguide, the corner-cube prism waveguide of my co-pending Nonprovisional patent application Ser. No. 09/621,888, which was filed in the U.S. Patent and Trademark Office Jul. 22, 2000.

FEDERALLY SPONSORED RESEARCH OR DEVELOPMENT

Not Available

REFERENCE TO MICROFICHE APPENDIX

Not Available

TECHNICAL FIELD OF INVENTION

This invention relates to semiconductor diode lasers, more specifically, to solid-state semiconductor diode lasers, which have multilayered vertical optical cavities that comprise a substrate, an electrically pumped double-heterostructure light emitting diode active-region, and an optically pumped solid-state active medium; all being components typically disposed between two feedback providing contra-positioned light reflecting structures.

BACKGROUND OF THE INVENTION

Solid-state semiconductor diode lasers have numerous applications in fields as varied as the automobile industry, medicine, scientific instrumentation, and telecommunications. Solid-state semiconductor diode lasers, specifically solid-state semiconductor diode lasers having a multilayered vertical optical cavity (i.e., vertical orientation that is perpendicular to the substrate of the semiconductor diode), which have become widely known, typically, as (VCSELs) "Vertical Cavity Surface Emitting Lasers".

Categorically, VCSEL light sources for use in gigabit-Ethernet network applications have been adopted in a remarkably short amount of time. Because VCSELs have a reduced threshold current, a circular output beam, and are inexpensive to manufacture at very high-volumes is what makes present day VCSELs particularly suitable for multi-mode optical fiber "Local-Area Networks" (i.e., LANs). Selectively oxidized VCSELs contain an oxide aperture within its vertical cavity that produces strong electrical and optical confinement, enabling high electrical-to-optical conversion efficiency, but minimal modal discrimination that allows emission into multiple transverse optical-modes. Such multi-mode VCSELs make ideal local area network laser light sources.

However, because they are inexpensive to manufacture, new VCSELs that can singularly emit at the fundamental optical transverse mode are ever increasingly being sought-out for emerging applications including long and short-haul data-communications using single-mode optical fiber, bar-code scanning, laser printing, optical read/write data-heads, and modulation spectroscopy. Achieving single-mode operation in selectively oxidized VCSELs is a challenging task, simply because the inherent index confinement within these high-performance lasers is very large. VCSELs have optical-cavity lengths on the order of one-wavelength and, therefore operate within a single longitudinal optical-mode.

Nevertheless, because of their relatively large cavity diameters (i.e., roughly "5.0" to "20.0" micrometers), these lasers will usually operate in multiple transverse optical-modes. Wherein, each transverse optical-mode will possess a unique wavelength and what is typically called a transverse spatial intensity profile (i.e., intensity pattern). For applications requiring small spot size or high spectral purity, lasing in a single transverse optical-mode, usually the lowest-order fundamental mode (i.e., TEM-00 mode) is desired.

In general, pure fundamental mode emission (i.e., a spatial intensity pattern seen as a simple circular shaped dot) within a selectively oxidized VCSEL can be attained by increasing the optical loss to higher-order transverse optical-modes relative to that of the previously mentioned fundamental lower-order transverse optical-mode. By selectively creating optical loss for any particular mode, we increase modal discrimination, which, consequently leads to a VCSELs operation in a single transverse optical-mode. Strategies for producing VCSELs that will operate in a single transverse optical-mode have recently been developed.

Furthermore, the previously mentioned strategies are based either on introducing loss that is relatively greater for higher-order optical-modes, thereby relatively increasing gain for the fundamental transverse optical-mode, or on directly creating greater gain for the fundamental transverse optical-mode. Increased modal loss for higher-order optical-modes has been demonstrated by three different techniques. The first approach to modal discrimination uses an etched-surface relief structure on the periphery of the top facet, which selectively reduces the reflectivity of the top mirror for the higher-order transverse optical-modes. The advantage of this technique is that the etched ring around the edge of the cavity in the top quarterwave mirror-stack assembly can be produced during the VCSEL's fabrication using conventional dry etching, or be post processed on a completed VCSEL die using focused ion-beam etching. The disadvantages, however, of an etched-surface relief structure is that it requires careful alignment to the oxide aperture or it can increase the optical scattering loss for the fundamental transverse optical-mode, as manifested by the relatively low (i.e., less than 2-mW) single-mode output powers that have been already reported. Therefore, it would be more desirable to introduce mode-selective loss into a VCSEL's epitaxial structure to avoid extra fabrication steps and problems with self-alignment and loss thereof.

Moreover, two such techniques are the use of tapered oxide apertures and extended optical cavities within VCSELs. The first approach pursued at Sadia National Laboratories (i.e., Albuquerque, N. Mex.) is typically called gain-guided design and it is predicated on designing the profile of the oxide aperture tip to preferentially increase loss for higher-order transverse optical-modes. For example, the aperture-tip profile can be produced by tailoring the composition of (AlGaAs) "Aluminum-Gallium-Arsenide" layers, which are specifically oxidized to create an electro-optic aperture within the before mentioned VCSEL's internal cavity. A VCSEL containing a tapered oxide structure whose tip is vertically and precisely positioned at the null of the longitudinal optical standing wave that occurs within the laser can produce greater than 3-mW of single transverse optical-mode output, and greater than 30-dB of side-mode suppression. Creating this kind of structure, however, requires a detailed understanding of the specifics regarding the oxidizing process and how it is implemented using specific materials, or tapered oxide structures improperly produced will cause additional loss rather than additional gain for the fundamental transverse optical-mode.

In addition, the second approach pursued at the University of Ulm (i.e., Ulm, Germany) is typically called index-guided design and it is predicated on designing a way to increase modal discrimination by extending the optical cavity length of VCSELs, thereby increasing the diffraction loss for the higher-order transverse optical-modes. Researchers at the University of Ulm (i.e., Ulm, Germany) have reported single fundamental optical-mode operation up to 5-mW using a VCSEL designed with a "4" micrometer thick cavity spacer inserted into its vertical optical cavity. The problem, however, is that by using even-longer cavity spacers we begin to introduce multiple longitudinal optical-modes (i.e., causing what is sometimes called spatial hole burning) into the laser's system, however, single fundamental lower-order transverse optical-mode operation up to nearly 7-mW has been demonstrated using this approach. It is interesting to note that VCSELs containing multiple wavelength cavities do not appear to suffer any electrical penalty, however, careful design is required to balance the trade-offs between the modal selectivity over a VCSEL's transverse and longitudinal optical-modes.

Finally, by manipulating the modal gain of a device rather than its loss can also produce single fundamental transverse optical-mode VCSELs. A technique to spatially aperture laser gain has been recently developed at Sadia National Laboratories. The essential aspect of a VCSEL designed using this approach is found in the VCSEL's lithographically defined gain region, which is produced by an intermixing of the VCSEL's quantum-well active-region at the lateral periphery of the VCSEL's vertical cavity.

Typically, well-known epitaxial processes of material deposition, like MBE or MOCVD, are used to epitaxially deposit the various materials that comprise the multilayered structure a VCSEL device(s). The fabrication process for a VCSEL typically begins with an epitaxial deposition of a bottom DBR quarterwave mirror-stack assembly onto an optical or semiconductor substrate material. The process continues with an epitaxial deposition of a VCSEL's active-region, which contains either a laser active medium comprising a single bulk semiconductor material or a single quantum well, or contains a laser active structure comprising a multiple quantum well or a multi-layered superlattice structure. The fabrication process for a VCSEL typically ends with an epitaxial deposition of a VCSEL's top DBR quarterwave mirror-stack assembly. Moreover, the quantum wells typically used in VCSELs are homogenized by ion-implantation around masked regions that form the optical cavities of the VCSEL lasers. The resultant VCSELs have a central quantum-well active-region that preferentially provides gain for the fundamental transverse lower-order optical-mode.

Consequently, for this approach an output of more than 2-mW with a side-mode-suppression ratio greater than 40-dB was obtained for an output of fundamental transverse optical-mode emission. Although, this approach requires greater fabrication complexity, it is anticipated that higher performance can be reached with further refinement of fabrication process parameters. Because new and greater demands are being made by existing commercial and future applications of VCSEL technology, new types of single-mode VCSELs are currently under development at numerous laboratories around the world. The techniques demonstrated to date introduce modal discrimination simply by increasing the optical loss for the higher-order modes or by simply increasing the relative gain of the fundamental transverse optical-mode.

Generally, in the case of VCSEL diode lasers, the laser beam obtained from these semiconductor devices usually comprises several different transverse modes. This leads to a divergence of the laser beam emitted by such solid-state semiconductor diode lasers. In order to obtain a high quality and less divergent beam, the problem of eliminating or reducing the level or the intensity of the transverse modes occurring within the solid-state semiconductor diode laser's cavity, consequently arises.

In addition, the pumping efficiency of a solid-state semiconductor diode laser's cavity is low, particularly in the case of a so-called stable cavity (e.g., planoconcave) solid-state semiconductor diode laser. There is also the problem of lowering the operating threshold of the previously described solid-state semiconductor diode lasers (i.e., the incident power necessary for operating the solid-state semiconductor diode laser). Prior art also describes that the pumping of solid-state semiconductor diode lasers is no longer coveted by conventional side emitting laser diodes, but now also exists within the realm of the "Vertical Cavity Surface Emitting Laser" (VCSEL) as well. As already stated VCSELs are semiconductor, lasers having vertical cavities that comprise electrically pumped multiple quantum well materials that also act as the VCSEL's optically pumped laser active medium.

However, the thickness of the VCSEL's active laser medium is very small; this is because the VCSEL's active laser medium only comprises a few quantum wells. Typically, the previously mentioned laser active medium that comprises a few quantum wells is surrounded by two light reflecting mirror structures, which especially in the case of VCSEL devices, are normally constituted by a successive epitaxial deposition of semiconductor thin films. The typical axis of a VCSEL's vertical cavity is perpendicular to the VCSEL's multilayered structure, hence the term "vertical cavity" laser.

Typically, a laser beam is emitted from a VCSEL's surface area, hence the term "surface emitting" lasers, as opposed to side emitting semiconductor lasers, which emit their laser beams from the laser's edge containing a partial light reflecting prism facet into a direction parallel to an edge emitting semiconductor laser's multilayered structure. VCSELs as laser pumping mechanisms, however, suffer from certain disadvantages. Firstly, the power density emitted by a VCSEL is low, being typically only about "50" milliwatts for a "30" millimeter beam; whereas, a conventional side emitting solid-state semiconductor diode laser might emit, for a same surface area, a power of approximately "1" Watt.

However, despite the disadvantages a laser beam emitted by a VCSEL diode laser has good properties. A VCSEL pumped solid-state semiconductor diode laser has a much better beam quality than a solid-state semiconductor diode laser pumped only by a conventional diode. The reason for this is because the structure typical to VCSELs (i.e., a very short cavity length) causes a natural reduction in beam divergence, while lowering the operational threshold of the solid-state semiconductor diode laser it pumps, as well. The spectral width in the emission of a VCSEL is lower than that of a conventional diode but comparable to the spectral width of the absorption band of solid-state microlasers (.DELTA..lambda..sub.abs .apprxeq.1 nm for a YAG microlaser, .DELTA..lambda..sub.emission .apprxeq.0.3 nm for a VCSEL and .apprxeq.3 nm for a 1 W power pumping diode).

Moreover, the geometry of the laser beam typically emitted by present day VCSEL devices is circular, symmetrical, not rectangular, and does not suffer from anamorphosis, as is the case with side emitting solid-state semiconductor diode lasers. This circular geometry permit an easier coverage of the laser beam emitted by a VCSEL device and the circular pattern typically exhibited by light occurring at the VCSEL's fundamental mode.

More particularly, in the case of a stabilized solid-state semiconductor diode laser cavity, the shape of the laser beam emitted by a VCSEL device is well adapted to the pumping of the present invention's fundamental mode. VCSELs emit a lower power density than conventional side emitting solid-state semiconductor diode lasers, but the previously mentioned density is better distributed for pumping light at the fundamental mode. Hence, there is a better pumping efficiency and, consequently a better pumping of solid-state semiconductor diode laser's fundamental mode.

In addition, the use of a solid-state laser active medium in addition to the active semiconductor material used to comprise a laser's light emitting diode active-region typically constitutes a layer of limited material thickness (i.e., between "150" and "1000" microns) and limited diameter size (i.e., several square millimeters). If, for design purposes, a solid-state active-medium material needs to be located within the optical cavity of its optical pumping semiconductor diode laser, the material used in constructing the solid-state semiconductor diode laser's active-medium needs to be epitaxially deposited onto the top and outermost surface of the last quarterwave plate used to construct the solid-state semiconductor diode laser's first quarterwave mirror-stack assembly, i.e. sometimes called the bottom or base "Distributed Bragg Reflector" (DBR). If, for design purposes, a solid-state active-medium material needs to be located outside the optical cavity of its optical pumping semiconductor diode laser, the material used in constructing the solid-state semiconductor diode laser's active-medium needs to be epitaxially deposited onto the top and outermost surface of the last quarterwave plate used to construct the solid-state semiconductor diode laser's second quarterwave mirror-stack assembly, i.e. sometimes called the top "Distributed Bragg Reflector" (DBR). Depending upon the design parameters of the laser device in question, the previously mentioned solid-state active-medium could be optically pumped from within a solid-state semiconductor diode laser's optical cavity, or it could be optically pumped from outside the solid-state semiconductor diode laser's optical cavity. Where the material that comprises a solid-state active-medium is either directly hybridized onto a solid-state semiconductor diode laser itself (i.e., inside or outside the solid-state semiconductor diode laser's resonant optical cavity), or the material that comprises a solid-state active-medium is coupled to the latter using an optical fiber.

In addition, the combination of a VCSEL diode laser and solid-state active-medium (i.e., YAG:Nd) offers several advantages over some prior art, including being easy to produce using any well known process of epitaxial deposition in the construction of its successive layers, all of which have different natures and functions (e.g., mirror, active medium, saturable absorber, etc.). The manufacturing a solid-state VCSEL diode lasers would require substrates of considerable dimensions (i.e., diameter "1" to "2" inches, i.e. "25.4" to "50.8" mm), where from the previously mentioned substrate it will be possible to produce several hundred or possibly several thousands solid-state VCSEL diode laser devices. Manufacturing processes well known within the microelectronics industry are now used to cut and assembly solid-state VCSEL diode lasers and, therefore makes it possible to collectively stage the isolation and assembly of each chip into a diode laser device.

In summarizing, prior art shows how the structure of a VCSEL diode laser makes it possible to improve the quality of the laser beam emitted by a solid-state semiconductor diode laser, especially, by improving the geometrical characteristics of the beam emitted by the solid-state VCSEL diode laser, by increasing the differential efficiency of the solid-state VCSEL diode lasers, and by reducing the solid-state VCSEL diode laser's operating threshold (i.e., in incident power).

Furthermore, to better understand the structural differences between the present invention's FCSSL design and prior art solid-state VCSEL diode laser technology, a typical example of a solid-state VCSEL diode laser design is described in detail below. Prior art, as illustrated in FIGS. 1, 2, 3, 4, 5, and 6 describes a solid-state VCSEL diode laser device, which uses a well known process of recombination "electron/hole" radiation (i.e., what is sometimes called "radiative recombination") to produce within an optical cavity electrically pumped fundamental light. The main difference between this prior art solid-state VCSEL diode laser design and most other prior art solid-state VCSEL diode laser designs is this prior art solid-state VCSEL diode laser design electrically pumps its diode active-region directly using two contact-layers, while most prior art solid-state VCSEL diode laser designs electrically pump their diode active-regions using an electrically conductive substrate and electrically conductive quarterwave mirror-stack assemblies, while they optical pump their solid-state active-medium's externally, by epitaxially depositing the solid-state active material outside their vertical cavities.

In addition, prior art as illustrated in FIGS. 1, 2, 3, 4, 5, and 6 shows a high-frequency version of a solid-state VCSEL diode laser design that uses its metallic supporting substrate 22 (FIGS. 1, 2, and 3) as both a base-reflecting mirror 22 and as a material growing substrate that is used for the subsequent growth of the various multilayered structures that will ultimately comprise the high-frequency solid-state VCSEL diode laser's physical structure. Multilayered material growth that begins with at a substrate material layer is typically the deposition process VCSEL devices use in epitaxially growing the contiguous layers that will ultimately comprise their multilayered structures. This is process is usually accomplished using a well-known material deposition process like MBE or MOCVD to epitaxially deposit the material in question. Hereinafter, the term "VCSEL(s)", instead of the previously used term "high-frequency solid-state VCSEL diode laser(s)" will be used to represent prior art.

Furthermore, as illustrated in FIGS. 1, 2, 3, 4, 5, and 6 a VCSEL's material supporting substrate 22, when made conductive as an alternative embodiment serves as the VCSEL(s) electrically negative electrode. The metallic supporting substrate 22 is comprised from a (Ni—Al) "Nickel-Aluminum" alloy-mixture, which has between an "8.0" to a "12.0" percent material lattice-mismatch, or more specifically, a "10.0" percent material lattice-mismatch to the binary (GaN) "Gallium-Nitride" semiconductor material deposited later. Despite the (Ni—Al) "Nickel-Aluminum" lattice-mismatch exhibited by the material, it is still the preferred metallic alloy-mixture used for this kind of electron conducting metallic supporting substrate 22. In addition, the (Ni—Al) "Nickel-Aluminum" metallic supporting substrate 22 (FIG. 3), if used as an alternative embodiment, would also need to exhibit a highly reflective property as well and, therefore should have a surface roughness of less than "15" atoms thick.

Furthermore, prior art as illustrated in FIGS. 1, 2, 3, 4, 5, and 6 shows several thin layers of (AlN) "Aluminum-Nitride" material, which are grown layer-upon-layer using MBE or MOCVD as the deposition process, until a buffer-layer 23 (FIG. 3) is built up epitaxially that has a thickness of only a few atoms. This buffer-layer 23 is used for facilitating the MBE or MOCVD epitaxial growth of the many subsequent semiconductor layers that will entirely comprise the high-frequency VCSEL device.

In addition, prior art as illustrated in FIGS. 1, 2, 3, 4, 5, and 6 shows that typically a high-frequency short-wavelength VCSEL design would have a lower "Distributed Bragg Reflector" (DBR) or quarterwave mirror-stack assembly 24 grown, epitaxially, onto the top and outermost surface of the previously mentioned buffer-layer 23A, 23B, 23C, 23D (FIGS. 1, 2, and 3) of (AlN) "Aluminum-Nitride" material using any suitable epitaxial crystal growing method, such as MBE or MOCVD. Moreover, prior art as illustrated in FIGS. 1, 2, 3, 4, 5, and 6 shows that a high-frequency VCSEL's quarterwave mirror-stack assembly 24 is typically constructed as a plurality of mirror pairs; or more precisely, as comprising a multitude of single pairs of alternating layers 24A, 24B (FIGS. 1, 2, and 3), which are constructed using "Gallium-Nitride" and "Aluminum-Gallium-Nitride" (GaN/AlGaN) semiconductor materials. The plurality of mirror pairs will include one or more layers of N-doped (GaN) "Gallium-Nitride" 24A, 24C, 24E, 24G, 24I (FIGS. 1, 2, and 3), which is a high refractive semiconductor material used to construct the first layer within each mirror pair, and N-doped (AlGaN) "Aluminum Gallium Nitride" 24B, 24D, 24F, 24H, 24J (FIGS. 1, 2, and 3), which is a low refractive semiconductor material used to construct the second layer within each mirror pair.

For example, prior art as illustrated in FIGS. 1, 2, 3, 4, 5, and 6 shows that a layer 24A of N-doped (GaN) "Gallium-Nitride is epitaxially deposited onto the top and outermost surface of a VCSEL's last buffer-layer 23D (FIGS. 1, 2, and 3), while a layer 24B (FIGS. 1, 2, and 3) of N-doped (AlGaN) "Aluminum Gallium Nitride" is subsequently and epitaxially deposited onto the top and outermost surface of the VCSEL's first N-doped (GaN) "Gallium-Nitride layer 24A, which form a VCSEL's first single mirror pair. If additional mirror-pairs are required, several more layers are used to make-up additional mirror-pairs, which are deposited, epitaxially, onto the existing layers of (GaN) "Gallium-Nitride and (AlGaN) "Aluminum Gallium Nitride" materials 24A, 24B, 24C, 24D, 24E, 24F, 24H, 24I (FIGS. 1, 2, and 3).

Moreover, to increase the reflectivity of a VCSEL's quarterwave mirror-stack assembly 24 (FIGS. 1, 2, and 3) to any required amount of reflectance, many additional mirror pairs may be required, and depending on the frequency of light being reflected, as many as several hundred pairs might be needed and used. However, it should be understood that the thickness and doping levels of each deposited layer used within VCSEL devices must be precisely controlled. Any deviation from designed parameters, no matter how slight, would affect the performance of the VCSEL device (i.e., frequency range, flux intensity). This greatly adds to the cost and complexity of manufacturing high frequency VCSEL devices and really VCSEL devices in general.

For example, prior art as illustrated in FIGS. 1, 2, 3, 4, 5, and 6 shows that a VCSEL's emitter-layer 34 (FIGS. 1, 2, and 3), being designed to emit high-frequency laser light having a wavelength of "200" nanometers, should have a material thickness that is one-quarter of one wavelength of the optical radiation to be emitted by the VCSEL device in question.

Consequently, to insure the amplification of a VCSEL's intra-cavity produced fundamental light and the extraction of frequency specific lased light this quantity must be the same for all of the layered material used to construct the VCSEL's first quarterwave mirror-stack assembly 24.

Therefore, prior art, as illustrated in FIGS. 1, 2, 3, 4, 5, and 6 shows that all of the layers used in the construction of a VCSEL's first quarterwave mirror-stack assembly 24 (FIGS. 1, 2, and 3) have a material thickness of "50" nanometers. The doping of specific layers within a VCSEL device is accomplished by the addition of various dopant materials (e.g., n-type electron donating dopants like Phosphorus and p-type electron accepting dopants like Boron). Material doping of specific layers is normally accomplished using a epitaxial deposition process like MBE or MOCVD, during which vaporized dopant material or gaseous dopant material is injected into a plasma mixture containing the deposition material(s) needing to be doped, where addition of a dopant material to a particular semiconductor material occurs during that particular semiconductor material's layered epitaxial deposition.

Typically, a VCSEL device will use many different dopant concentrations of specific dopant materials within the several different extrinsic semiconductor layers that make-up a VCSEL's multilayered structure. For example, alternating layers of (GaN) "Gallium-Nitride" 23A (FIGS. 1, 2, and 3) and N-doped (AlGaN) "Aluminum Gallium Nitride" 23B (FIGS. 1, 2, and 3), which are used to facilitate construction of a VCSEL's first quarterwave mirror-stack assembly 24 (FIGS. 1, 2, and 3) can be made n-type conductive when doped with either "Selenium" or "Silicon" using a dopant concentration ranging from "1E15" to "1E20" cubic-centimeters with a preferred range from "1E17" to "1E19" cubic centimeters, while a nominal concentration range of doping would be from "5E17" to "5E18" cubic centimeters. The percentage of dopant composition used in a VCSEL's first quarterwave mirror-stack assembly 24 could be stated as (AlxGaxN/GaN), where x represents a variable of "0.05" to "0.96", while in a preferred embodiment x would represent an amount greater than "0.8".

Moreover, prior art as illustrated in FIGS. 1, 2, 3, 4, 5, and 6 shows that the plurality of alternating layers used to construct a VCSEL's first quarterwave mirror-stack assembly 24 are typically deposited onto the top and outermost surface of the VCSEL's buffer-layer of (AlN) "Aluminum-Nitride" 23 using a well known process of epitaxial deposition.

In addition, prior art as illustrated in FIGS. 1, 2, 3, 4, 5, and 6 shows the layer next in line for epitaxial deposition is a VCSEL's first contact-layer 25 (FIGS. 1, 2, and 3), which is comprised from a highly +n-doped (GaN) "Gallium-Nitride" binary semiconductor material epitaxially grown onto the top and outermost surface of the last alternated layer used in the construction of the VCSEL's first quarterwave mirror-stack assembly 24 (FIGS. 1, 2, and 3). A VCSEL's first contact-layer 25, while providing connectivity to the VCSEL's n-metal contact 27 (FIGS. 1, 2, and 3), and to the VCSEL's n-metal contact-ring 26 (FIGS. 1, 2, and 3), also enhances the reliability of the VCSEL's design by preventing the migration of carrier-dislocations, and the like, to the VCSEL's active-region 28 (FIGS. 1, 2, and 3).

Furthermore, prior art as illustrated in FIGS. 1, 2, 3, 4, 5, and 6 also shows that to prevent the overcrowding of the cladding-layers within a VCSEL's active-region 28, each cladding-layer is illustrated as being a single separate layer 28A, 28C (FIGS. 1, 2, and 3). It should also be understood that each cladding-layer could also be made using more than one layer, where each cladding-layer 28A, 28C would be epitaxially deposited onto a previous cladding-layer, where each cladding-layer 28A, 28C would be comprised from a N-doped or a P-doped (AlGaN) "Aluminum-Gallium-Nitride" ternary semiconductor material, or any other frequency specific and application determining doped material available.

Furthermore, prior art as illustrated in FIGS. 1, 2, 3, 4, 5, and 6 shows that the next layer(s) next in line for epitaxial deposition is a VCSEL's active-region 28 (FIGS. 1, 2, and 3), which is shown as being represented by either a single layer presented here as comprising a (SQW) "Single Quantum Well" epitaxially deposited onto the top and outermost surface of the VCSEL's first cladding-layer 28A (i.e., sometimes called a cladding-barrier). It should be understood, however, that a VCSEL's active-region 28 could also include one or more quantum-wells and one or more quantum-well cladding-layers, as is typical of MQW structures. More particularly, a first quantum-well cladding-layer, a second quantum-well cladding-layer, and a quantum-well layer 28B shown as being positioned between a first cladding-layer 28A and a second cladding-layer 28C. Prior art, as illustrated in FIGS. 1, 2, 3, 4, 5, and 6 describes a VCSEL's active-area 28B as being comprised as a SQW that is constructed from a p-doped (InGaN) "Indium-Gallium-Nitride" extrinsic ternary semiconductor material using MBE or MOCVD to epitaxially deposit the material onto the top and outermost surface of the VCSEL's first cladding-layer 28A.

In addition, prior art as illustrated in FIGS. 1, 2, 3, 4, 5, and 6 shows the next layer in line for epitaxial deposition is a VCSEL's second contact-layer 29 (FIGS. 1, 2, and 3), which is comprised from a highly +p-doped (GaN) "Gallium-Nitride" extrinsic binary material that is epitaxially grown onto the top and outermost surface of the VCSEL's second cladding-layer 28C. A VCSEL's second contact-layer 29, while providing connectivity to the VCSEL's p-metal contact 31 (FIGS. 1, 2, and 3), and to the VCSEL's p-metal contact-ring 30 (FIGS. 1, 2, and 3), will also enhance the reliability of the VCSEL's design by preventing the migration of carrier-dislocations, and the like, to the VCSEL's active-region 28.

In addition, prior art as illustrated in FIGS. 1, 2, 3, 4, 5, and 6 shows the next layer in line for epitaxial deposition is a VCSEL's solid-state laser-active medium 32, which typically constitutes a layer of limited material thickness (i.e., between "1" and "1000" microns) and limited diameter size (i.e., one to several microns in diameter) that is epitaxially deposited onto the top and outermost surface of the VCSEL's second contact-layer 29. The material used to comprise the laser-active medium layer 32 is typically chosen from one of the following materials: YAG ($Y_3Al_5O_{12}$), LMA ($LaMgAl_{11}O_{19}$), $YVO_4$, YSO ($Y_2SiO_5$), YLF ($YLiF_4$), or $GdVO_4$, etc. Choice criteria for one or other of these materials are given in EP-653 824 (U.S. Pat. No. 5,495,494). This document also gives information on the choice of the thickness of the active-medium, particularly for obtaining a monomode laser, typically, the thickness of the active-medium is approximately: "750" micrometers for a YAG active-medium, "500" micrometers for an $YVO_4$ active-medium, "150" micrometers for a LMA active-medium. Concerning the doping ions, a choice is generally made of neodymium (Nd) for a laser emission around "1.06" micrometers. It is also possible to choose Erbium (Er) or an Erbium-Ytterbium codoping (Er+Yb) for an emission of around "1.5" micrometers. For an emission around "2" micrometers a choice is made of Thulium (Tm), or Holmium (Ho), or a Thulium-Holmium codoping. Doping with Ytterbium makes it possible to obtain an emission at "1.03" micrometers. It is also possible to produce an active-medium constituted by glass, e.g. doped with Erbium and Ytterbium (i.e., emission at "1.55" micrometers), as explained in the article by P. Thony et al. entitled "1.55 micrometers wavelength CW microchip laser", Proceedings of Advanced Solid-State Laser 1996, San Francisco, where the doped glass active-medium is consequently dielectric.

In addition, prior art as illustrated in FIGS. 1, 2, 3, 4, 5, and 6 shows the layer(s) next in line for epitaxial deposition is a VCSEL's second quarterwave mirror-stack assembly 33, which is made from a plurality of structures comprised as mirror pairs. More precisely, a plurality of mirror pairs comprising two epitaxially deposited layers 32A, 32B (FIG. 3) are constructed when two optical materials having opposed refractive indices are alternately used during a mirror pair's deposition.

For example, prior art as presented here, describes a single mirror pair as comprising two epitaxially deposited layers, which are constructed using "Aluminum-Oxide" a high-refractive optical material deposited as the first layer in each mirror pair, and "Zinc-Oxide" a low-refractive optical material deposited as the second layer in each mirror pair, these materials having opposed refractive indices create a highly reflective mirror pair of (Al2O3/ZnO). Ion sputtering, a well-known method for depositing dielectric materials is used to create all of the mirror pairs of (Al2O3/ZnO) that will ultimately comprise a VCSEL's second quarterwave mirror-stack assembly. The construction of additional mirror pairs is accomplished by a repeated deposition of additional layers, which are alternatively constructed using "Aluminum-Oxide" and "Zinc-Oxide" materials, alternating the deposition of "Aluminum-Oxide" material with "Zinc-Oxide" material, next alternating back to "Aluminum-Oxide" material. To explain further, mirror pairs are the building blocks used to construct a VCSEL's second quarterwave mirror-stack assembly, which will include one or more layers of undoped (Al2O3) "Aluminum-Oxide" a high-refractive dielectric material (i.e., sometimes called Corundum or manufactured Sapphire) 33A, 33C, 33E, 33G, 33I (FIG. 3), and one or more layers of undoped (ZnO) "Zinc-Oxide" a low-refractive dielectric material 33B, 33D, 33F, 33H (FIG. 3). For example, prior art as illustrated in FIGS. 1, 2, 3, 4, 5, and 6 describes a VCSEL's second quarterwave mirror-stack assembly as comprising first a "200" nanometer thick layer of (Al2O3) "Aluminum-Oxide" 33A, which is epitaxially deposited onto the top and outermost surface of a VCSEL's laser-active medium layer 32 (FIG. 3). Next, a first "200" nanometer thick layer of (ZnO) "Zinc-Oxide" 33B (FIG. 3) is subsequently and epitaxially deposited onto the top and outermost surface of the previously deposited first "200" nanometers thick layer of (Al2O3) "Aluminum-Oxide" 33A (FIG. 3) material, thereby forming a first mirror pair of (Al2O3/ZnO). If additional mirror-pairs are required, than several more layers, used to comprise additional mirror-pairs, can be deposited onto the top and outermost surface of the existing layers of alternatively deposited (Al2O3) "Aluminum Oxide" and (ZnO) "Zinc Oxide" materials 33A, 33B, 33C, 33D, 33E, 33F, 33G, 33H, 33I (FIG. 3). To increase the reflectivity of a VCSEL's second quarterwave mirror-stack assembly 33 (FIG. 3) to the required amount of partial-reflectance, many additional mirror pairs will be required, and depending upon the frequency of light being reflected, as many as several hundred mirror pairs might be used in creating a VCSEL's second quarterwave mirror-stack assembly.

In addition, prior art as illustrated in FIGS. 1, 2, 3, 4, 5, and 6 shows a VCSEL's emitter layer 34 as being constructed from undoped (ZnO) "Zinc-Oxide", a highly refractive dielectric amorphous optical material used to create the VCSEL's last deposited layer, which is epitaxially deposited onto the top and outermost surface of the last layer of "Aluminum-Oxide" that was used to construct a VCSEL's second quarterwave mirror-stack assembly. Deposition is accomplished by using a well-known method for depositing dielectric materials called ion sputtering, which is normally used to epitaxially deposit dielectric amorphous materials like (ZnO) "Zinc-Oxide" onto an existing layer.

In addition, prior art as illustrated in FIGS. 1, 2, 3, 4, 5, and 6 shows that a VCSEL's p-metal contact 31 and p-metal contact-ring 30 are formed onto the top and outermost surface of the VCSEL's second contact-layer 29 (FIGS. 1, 2, and 3), by disposing any suitable conductive material, such as Indium-Tin-Oxide, Gold, Zinc, Platinum, Tungsten, or Germanium metallic alloys. Prior art, as illustrated in FIGS. 1, 2, 3, 4, 5, and 6 describes how a VCSEL's n-metal contact 27 (FIGS. 1, 2, and 3) and n-metal contact-ring 26 (FIGS. 1, 2, and 3) are formed onto the top and outermost surface of the VCSEL's first contact-layer 25 (FIGS. 1, 2, and 3), which is typically accomplished by disposing any suitable conductive material, such as Indium-Tin-Oxide, Gold, Zinc, Platinum, Tungsten, or Germanium metallic alloys. Furthermore, it should also be understood that a chosen method of material deposition depends upon which material is selected for constructing a VCSEL's electrical contacts 26, 27, 30, 31 (FIGS. 1, 2, and 3). Therefore, specific methods of material disposition, disposing, and patterning onto the VCSEL's first and second contact-layers 25, 29, for any specific material, must be considered in the construction of the VCSEL's electrical contacts 26, 27, 30, 31 (FIGS. 1, 2, and 3).

Moreover, prior art as illustrated in FIGS. 1, 2, 3, 4, 5, and 6 shows that the next layer in line for deposition is a VCSEL's second contact-layer 29 (FIGS. 1, 2, and 3), a VCSEL's second cladding-region 28C, a VCSEL's active-area 28B, and a VCSEL's first cladding-layer 28A (FIGS. 1, 2, and 3), all of which are mesa-etched structures, which will define the overall shape and structure of the VCSEL's lower layers, while diameter dimensions for a VCSEL's lower layers remain substantially larger over the VCSEL's top deposited emitter-layer 34 (FIGS. 1, 2, and 3) and the emitter-layer's support 29. As mesa etching of a VCSEL's main structures are completed a VCSEL's p-metal contact 31 (FIGS. 1, 2, and 3) and p-metal contact-ring 30 (FIGS. 1, 2, and 3) are to be deposited onto the top and outermost surface of the VCSEL's second contact-layer 29 leaving, therein the VCSEL's emitter-layer area open 34.

In addition, the deposition of a VCSEL's n-metal contact, as an alternative embodiment, can be deposited onto the top and outermost surface of the VCSEL's metallic supporting substrate 22 (FIGS. 1, 2, and 3) comprised from (NiAl) "Nickel-Aluminum" alloy, which would allow the metallic supporting substrate 22 to also function as an electrically negative contact-layer. Prior art, as illustrated in FIGS. 1, 2, 3, 4, 5, and 6 shows a VCSEL's metallic supporting substrate-layer 22, when it is used in conjunction with a quarterwave mirror-stack assembly 24 (FIGS. 1, 2, and 3) that is constructed as a multitude of mirror pairs using highly reflective (AlGaN/GaN) "Aluminum-Gallium-Nitride/Gallium-Nitride" material, will provide for approximately "99.99" percent of the VCSEL's total reflectivity. Furthermore, prior art as illustrated in FIGS. 1, 2, 3, 4, 5, and 6 shows how high-frequency VCSEL devices can be grouped together and configured as a linear array of high-frequency surface emitting diode lasers.

However, while the present invention might typically use a vertically oriented double-heterostructure light emitting diode to produce fundamental photonic radiation, its folded cavity, and the physics that occur there, is quit different from those that occur within a typical solid-state VCSEL diode laser. Therefore, the present invention should by all accounts be categorized as a new type of solid-state semiconductor diode laser.

For example, the present invention uses only one mirror structure to provide for both a highly reflective input mirror and a partially reflective output mirror, while replacing the normally used second mirror altogether with a polyhedral shaped prism waveguide, which is constructed from a transparent solid-state laser-active medium material like YAG, YVO, or LMA. Obviously, the present invention has a novel and redefined vertical cavity that will provide preferentially gain for the fundamental lower-order optical-mode, which will result in single transverse lower-order optical-mode output emissions. Inspired by the present invention's unique folded cavity design, the fact that its polyhedral shaped prism waveguide is constructed from a solid-state active-medium, and because of the optical physics that occur therein, I have for future identification named this new solid-state semiconductor diode laser design the "Folded Cavity Solid-State Laser" (FCSSL).

SUMMARY OF THE INVENTION

In accordance with the present invention, a Folded Cavity Solid-State Laser comprises a cavity folding polyhedral shaped prism waveguide having at least one internal reflecting prism that provides a cavity folding transverse redirection of intra-cavity produced fundamental photonic radiation back into the light-amplifying laser-active material that was used in its construction (i.e., YAG:Nd, YVO, or LMA), a semiconductor double-heterojunction light emitting diode active-region comprising an active-area, which provides both the electrical production and the optical pre-amplification of intra-cavity produced fundamental photonic radiation, a dichroic-mirror structure capable of reflecting a sufficient amount of undiffused optical radiation, while providing the feedback apparatus that redirects intra-cavity produced optical radiation radiation back into the laser-active material (i.e., YAG:Nd, YVO, or LMA) used to construct the polyhedral shaped prism waveguide for further amplification, while providing an apparatus that will also provide a frequency-selected output of frequency-specific monochromic amplified photonic radiation.

Objects and Advantages

Accordingly, besides the objects and advantages of the Folded Cavity Solid-State Laser described in the above patent, several objects, and advantages of the present invention are:

(a) To provide a folded cavity solid-state laser that creates a high output of narrow-linewidth amplified light using a cavity folding internal reflecting polyhedral prism waveguide comprised from a single layer of optically amplifying laser-active material;

(b) To provide a folded cavity solid-state laser that is inexpensive to manufacture, because it eliminated the expensive epitaxial deposition of a bottom positioned quarterwave mirror-stack assembly comprising a multitude of layers, and replaced it with a single dielectric polyhedral prism waveguide, which is constructed from a single inexpensive layer of sputter or epitaxially deposited material;

(c) To provide a folded cavity solid-state laser that uses two graded confinement cladding-layers to generate higher output emission;

(d) To provide a folded cavity solid-state laser that produces a more effective output gain using two graded confinement cladding-layers to lower the heat which is produced by electrical resistance between current conducting contact-layers and cladding-layers;

(e) To provide a folded cavity solid-state laser, which increases optical confinement with the addition of total internal reflecting cladding material to the surrounding vertical and outermost wall surfaces of the folded cavity solid-state laser's folded vertical cavity(s);

(f) To provide a folded cavity solid-state laser, which can be configured and controlled as a single folded cavity solid-state laser device;

(g) To provide a folded cavity solid-state laser, which can be configured as a single folded cavity solid-state laser-array comprising a multitude of diodes, which are controlled as a single group of folded cavity solid-state lasers (i.e., sometimes called a solid-state laser-array) or controlled as a single group of independently controlled folded cavity solid-state lasers;

(h) To provide a folded cavity solid-state laser or a folded cavity solid-state laser-array, which can be manufactured at the same time and from the same semiconductor substrate material used to construct the laser-array's control-circuitry, all of which, would be contained within a single integrated semiconductor device;

(j) To provide a folded cavity solid-state laser that replaces a bottom quarterwave mirror-stack assembly with a polyhedral prism waveguide which, if comprised of quartz or fused silica, can totally reflect one-hundred percent all frequencies of optical radiation that enters a polyhedral prism waveguide's top front-face flat horizontal surface;

(k) To provide a folded cavity solid-state laser, which can inexpensively construct its polyhedral prism waveguide using a well-known ion-milling process to slice out the waveguide's prism facet(s);

(l) To provide a folded cavity solid-state laser that can deposit a dielectric material like fused-silica onto any construction material that might be used to construct any frequency producing semiconductor diode or combination thereof that could possibly be used to construct a folded cavity solid-state laser or a folded cavity solid-state laser-array;

(m) To provide a folded cavity solid-state laser, which uses an amorphous material like "Lithium-Fluoride" (LiF) to create an optical cladding layer, which is deposited around each vertical cavity or cavities, creating a structure providing for the total internal reflection of intra-cavity produced light, thermal dispersive, and added support to a folded cavity solid-state laser's polyhedral prism waveguide structure(s);

(n) To provide a folded cavity solid-state laser, which increases its output, while maintaining a narrow linewidth for its output emissions(s);

(o) To provide a folded cavity solid-state laser, which has eliminated the need to pre-deposit buffer layers of growth promoting materials like "Aluminum-Nitride" onto a diode(s) substrate layer;

(p) To provide a folded cavity solid-state laser, which will produce an increase of nearly 7-mW to its output emissions;

(q) To provide a folded cavity solid-state laser, which increases gain to its emission output by using a laser active medium like YAG:Nd as the material used in the construction the folded cavity solid-state laser's polyhedral prism waveguide.

Further objects and advantages are to provide a folded cavity solid-state laser, where the selection of a semiconductor or the selection of an optical material over another that might be used in the construction of the folded cavity solid-state laser's active-region, polyhedral prism waveguide, and quarterwave mirror-stack assembly is not determined by any structural need or lattice compatibility, but by a particular application's need for frequency specific laser output. The materials used in the construction of the present invention FCSSL as presented here are only one yet preferred example of a group of several frequency-specific materials that might be used in the construction of the present invention's frequency-transcendent multilayered structure. The advantage is that the novel features and the un-obvious properties that lie behind a folded cavity solid-state laser's cavity folding structure, because they can exist, and occur, using any frequency-specific semiconductor or optical material, shows that the various structures that comprise folded cavity solid-state laser(s) have a sufficient novelty and a non-obviousness that are independent of any one particular semiconductor or optical material that might or could be used in the construction of folded cavity solid-state laser(s).

Still further objects and advantages will become apparent from a consideration of the ensuing description and drawings.

DRAWING FIGURES

In the drawings, closely related figures have the same number but different alphabetic suffixes.

FIG. 16A shows an orthographic plan top-view of the present invention's conical shaped polyhedral prism waveguide, which displays the raytraced pathway of an internally reflected light-ray.

FIG. 16B shows a three-dimensional isometric top side-view of the present invention's conical shaped polyhedral prism waveguide, which displays the raytraced pathway of an internally reflected light-ray.

FIG. 17 shows a schematic drawing that displays the typical energy profiles for the multiple quantum-well active-area used by the FCSSL design.

REFERENCE NUMERALS IN DRAWINGS

Figure 1:
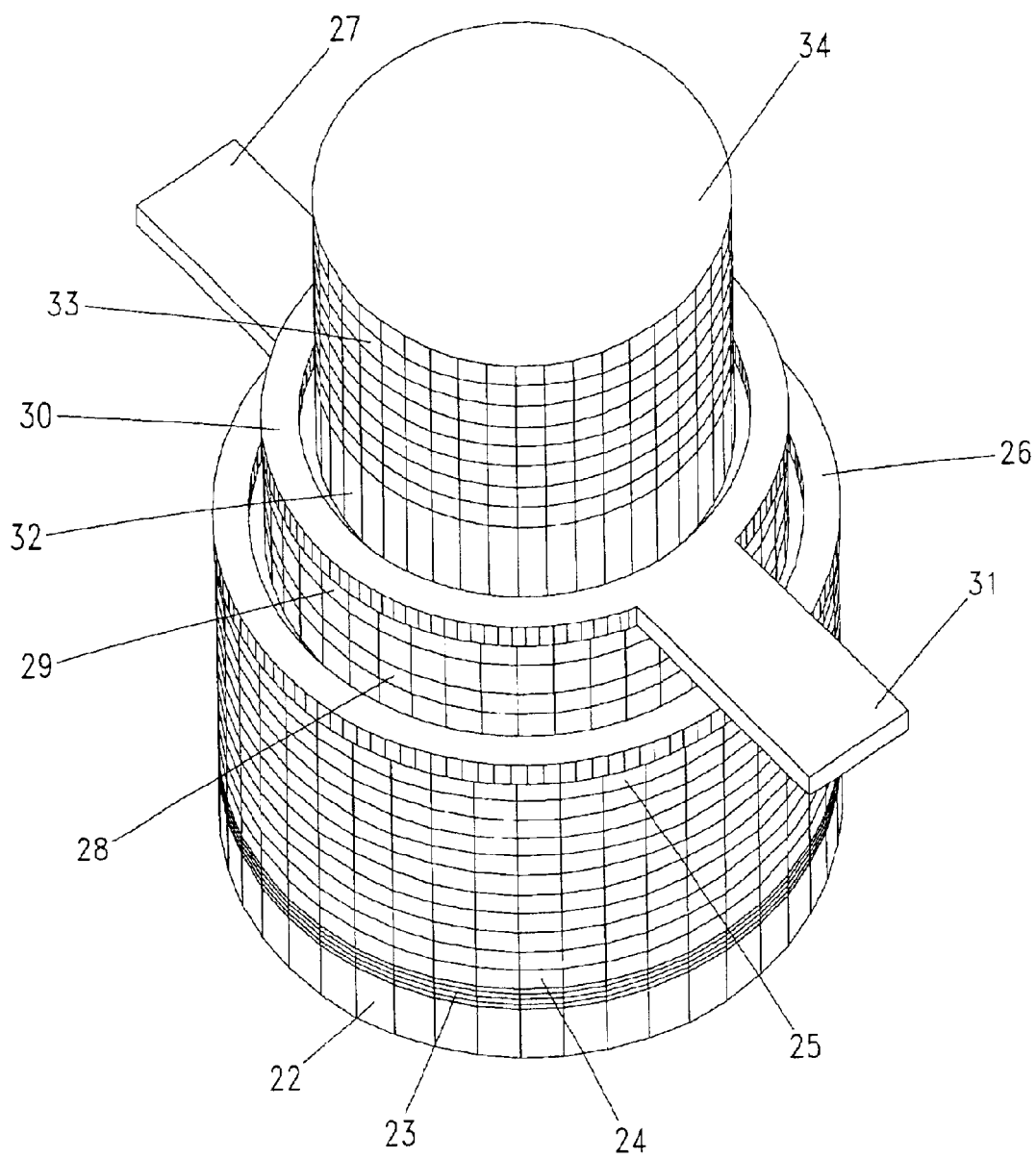
FIG. 1 shows prior art, illustrated as a three-dimensional sixty-degree isometric top front-view drawing of a solid-state VCSEL diode laser, which displays a multilayered structure comprising a substrate-layer, a first quarter-wave mirror-stack assembly, an active-region, a laser-active layer, a second quarterwave mirror-stack assembly, and an emitter-layer.

In the drawings, closely related reference numerals have the same number but different alphabetic suffixes.
22 substrate.
23 buffer-layer.
24 first quarterwave mirror-stack assembly.
25 +n-doped contact-layer.
26 n-metal contact-ring.
27 n-metal contact.
28 active-region containing an active-area comprised as a SQW or a MQW.
29 +p-doped contact-layer.
30 p-metal contact-ring.
31 p-metal contact.
32 laser-active medium layer.
33 second quarterwave mirror-stack assembly.
34 emitter-layer.
35 corner-cubed shaped polyhedral prism waveguide.
36 +n-doped contact-layer.
37 active-region containing an active-area comprised as a SQW or a MQW.
38 +p-doped contact-layer.
39 quarterwave mirror-stack assembly.
40 emitter-layer.
41 optical cladding material.
42 raytraced pathway of a corner-cube waveguide propagating light-ray.
43 c-axis of corner-cube shaped polyhedral prism waveguide.
44 right-angle shaped polyhedral prism waveguide.
45 raytraced pathway of a right-angle waveguide propagating light-ray.
46 c-axis of right-angle shaped polyhedral prism waveguide.
47 conical shaped polyhedral prism waveguide.
48 raytraced pathway of a conical waveguide propagating light-ray.
49 c-axis of conical shaped polyhedral prism waveguide.
50 multiple quantum well layer.
51 multiple quantum well cladding-layer.
52 alternative active-region's +n-doped contact-layer.

53 alternative active-region's active-area.
alternative active-region's +p-doped contact-layer.
55 optically centered and gain-optimizing light-wave.

DESCRIPTION

Preferred Embodiment

Figure 7:
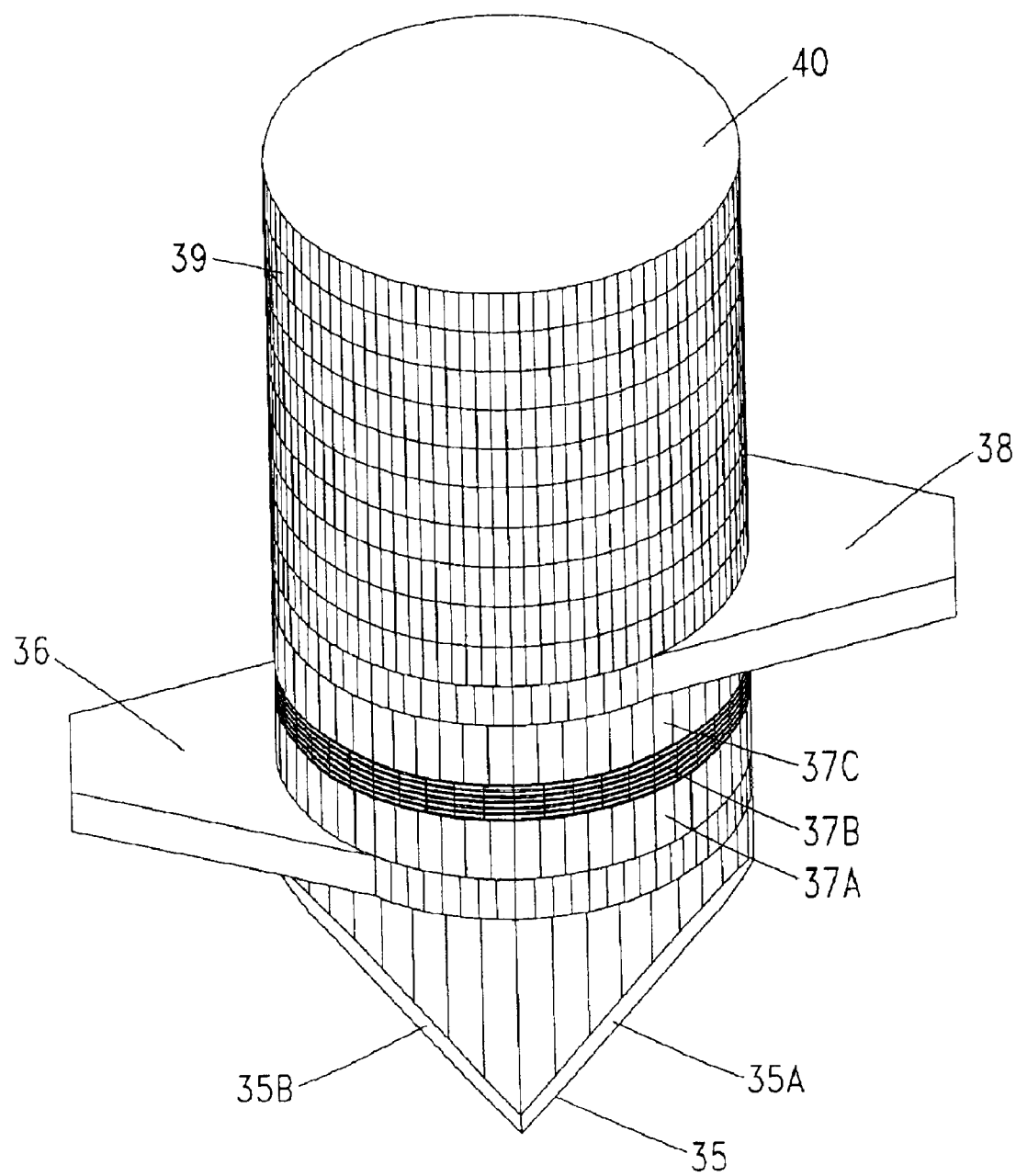
FIG. 7 shows the present invention, illustrated as a three-dimensional sixty-degree isometric top front-view drawing of a FCSSL, which displays a multi-layered structure comprising a cavity folding corner-cube shaped polyhedral prism waveguide, a MQW active-region, a quarterwave mirror-stack assembly, and an emitter-layer.
Figure 8:
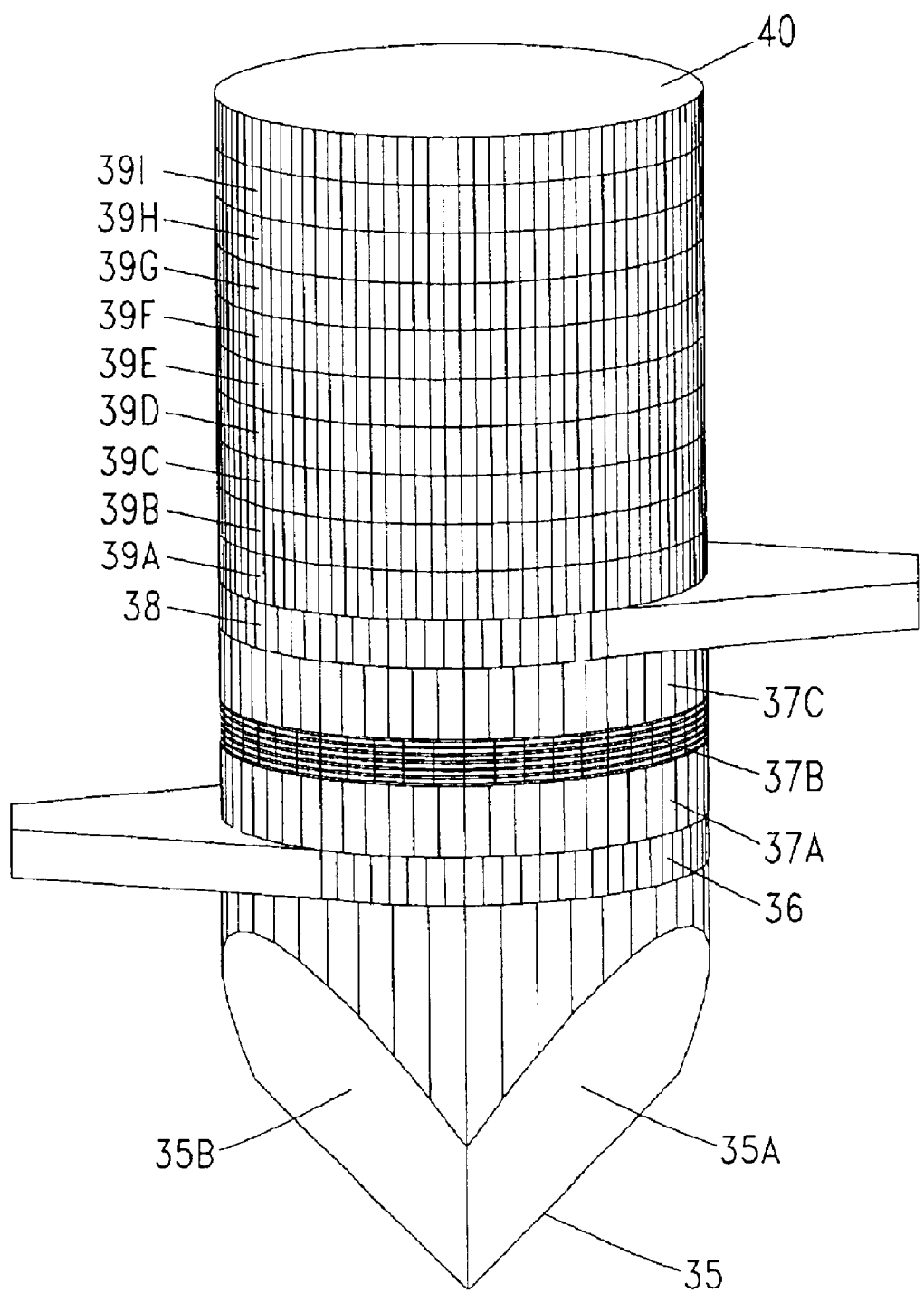
FIG. 8 shows the present invention, illustrated as a three-dimensional thirty-degree isometric top front-view drawing of a FCSSL, which displays a multilayered structure comprising a cavity folding corner-cube shaped polyhedral prism waveguide, a MQW active-region, a quarterwave mirror-stack assembly, and an emitter-layer.
Figure 9:
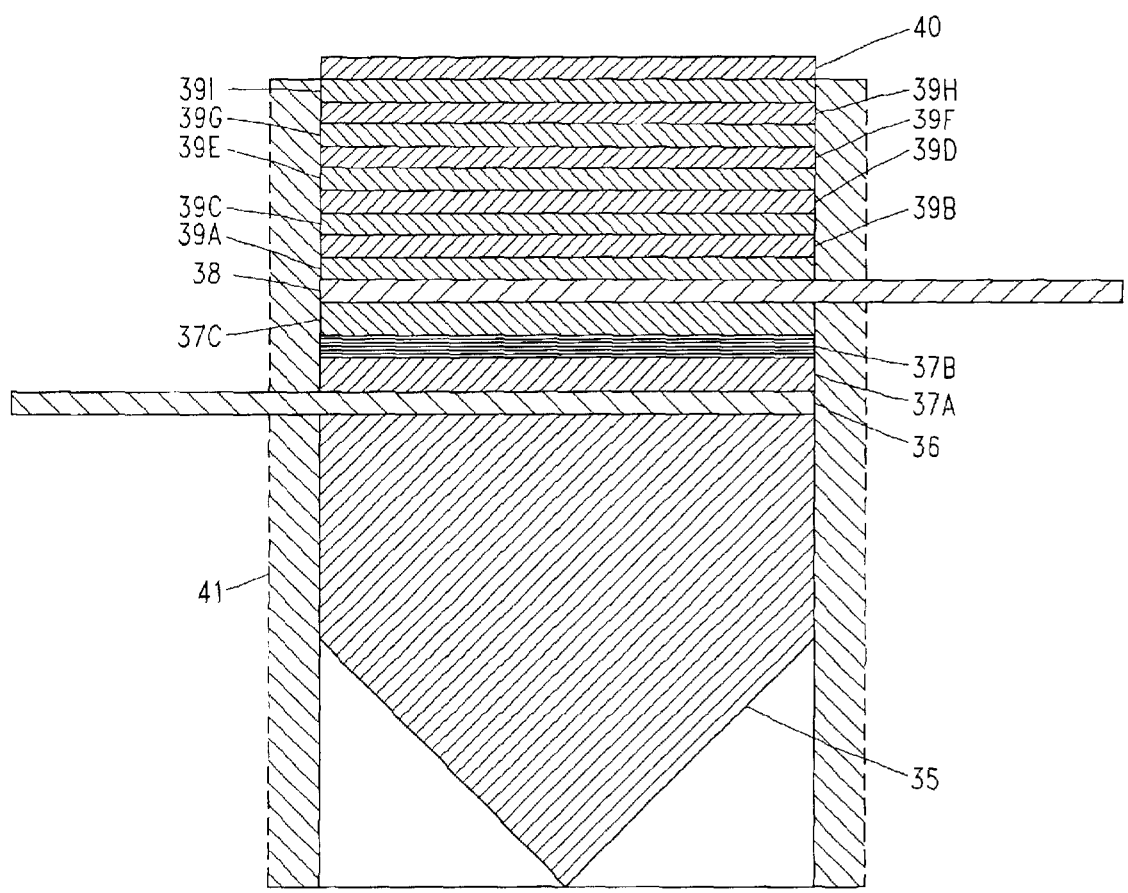
FIG. 9 shows the present invention, illustrated as an orthographic vertical-section side-view drawing of a FCSSL, which displays a multilayered structure comprising a cavity folding corner-cube shaped polyhedral prism waveguide, a MQW active-region, a quarterwave mirror-stack assembly, and an emitter-layer.
Figure 10:
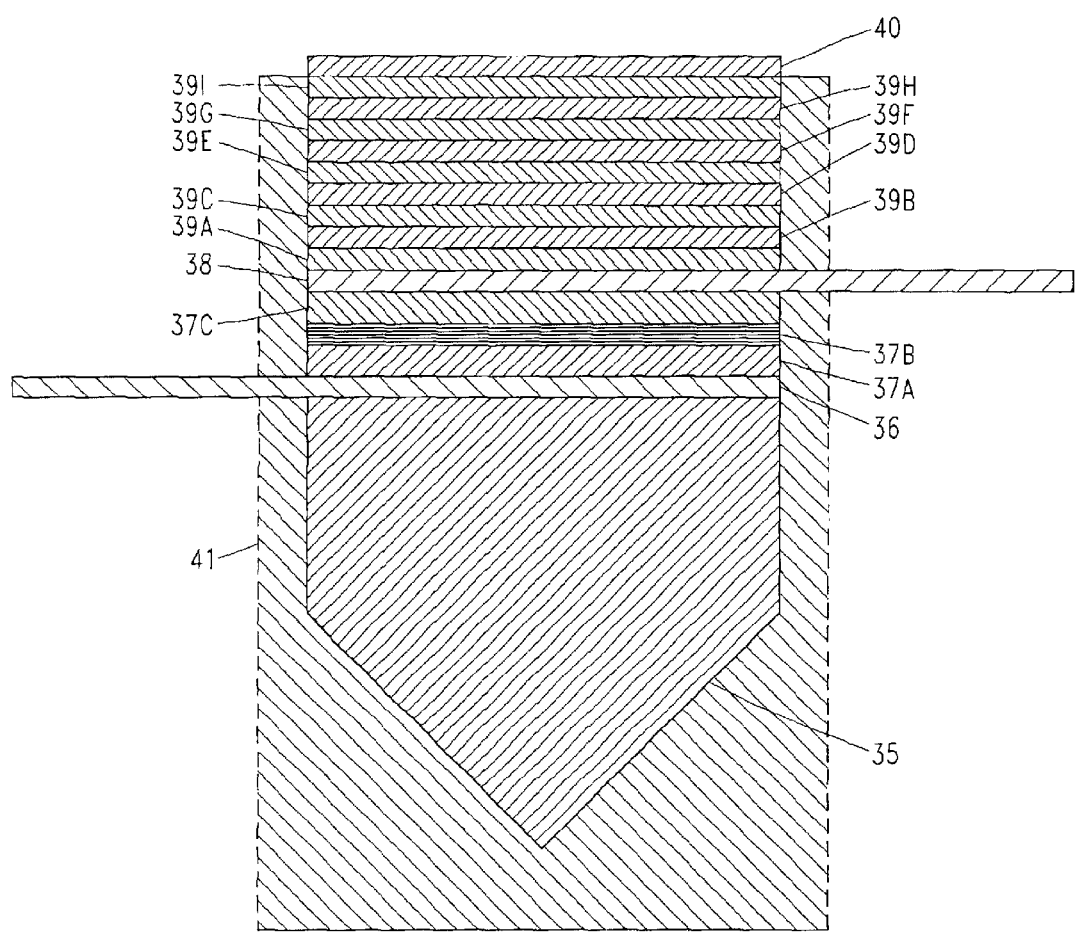
FIG. 10 shows the present invention, illustrated as an orthographic vertical-section side-view alternative drawing of a FCSSL, which displays a multilayered structure comprising a cavity folding corner-cube shaped polyhedral prism waveguide, a MQW active-region, a quarterwave mirror-stack assembly, and an emitter-layer.
Figure 11:
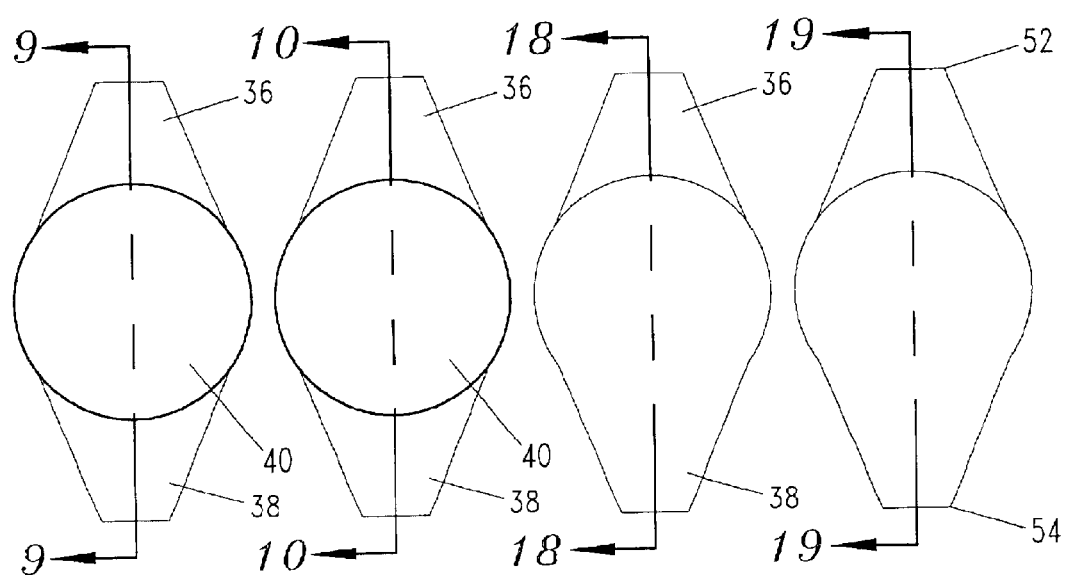
FIG. 11 shows the present invention, illustrated as an orthographic plan-view drawing, which displays a linear array of two FCSSLs and two FCSSL active-regions, while showing section lines 9—9, 10—10, 18—18, and 19—19.

A preferred embodiment of the present invention as illustrated in FIGS. 7 and 8 (i.e., two three-dimensional isometric-views of the FCSSL, displaying the FCSSL's numbered semiconductor multilayers), and in FIGS. 9 and 10 (i.e., side view drawings of sections 9—9 and 10—10) displaying the present invention's use of a double-heterostructure light emitting diode design, which is configured as an active-region 37 comprising a "Multiple Quantum Well" (MQW) active-area 37B (FIGS. 7, 8, 9, and 10), two contra-positioned graded confinement cladding-layers 37A, 37C (FIGS. 7, 8, 9, and 10), a positive contact-layer 38 (FIGS. 7, 8, 9, and 10), and a negative contact-layer that doubles as the device's crystal growing substrate layer 36 (FIGS. 7, 8, 9, and 10). Wherein, the preferred embodiment of the double-heterostructure light emitting diode design is shown to improve the performance of the present FCSSL invention in several ways:

(i) By replacing conventional non-graded confinement cladding-layers 28A, 28C (FIGS. 1, 2, and 3) 52A, 52E (FIG. 19), which are normally used in today's double-heterostructure diode designs with graded confinement cladding-layers 37A, 37C (FIGS. 7, 8, 9, and 10) we increase the confinement of both electrons and holes to a FCSSL's MQW active-area 37B (FIGS. 7, 8, 9, and 10). The graded confinement cladding-layers, by increasing confinement of both electrons and holes to a FCSSL's MQW active-area 37B (FIGS. 7, 8, 9, and 10), they also increase the process of "population inversion" occurring within the FCSSL's MQW active-area 37B as well.

(ii) Because the graded confinement cladding-layers 37A, 37C (FIGS. 7, 8, 9, and 10) are created using a semiconductor material having a refractive index that changes gradually and evenly from high to low over the graded confinement cladding-layer's entire thickness, a high degree of reflectance is maintained, while the light scattering losses normally caused by internal photonic reflections at the material boundaries of typical non-graded confinement cladding-layers 28A, 28C (FIGS. 1, 2, and 3) 52A, 52E (FIG. 19) is eliminated, thus greatly improving the gain and linewidth of a FCSSL's emission output.

(iii) By using graded confinement cladding-layers 37A, 37C (FIGS. 7, 8, 9, and 10) with an evenly graded distribution of dopant materials, where the amount of dopant levels are higher at the material boundaries between contact-layers and cladding-layers, we greatly reduce the resistance to electrical current at the previously mentioned material boundaries. By reducing resistance at the material boundaries between contact-layers and cladding-layers, we also increased current confinement, while reducing internally created and loss producing heat.

(iv) By using two graded confinement cladding-layers 37A, 37C (FIGS. 7, 8, 9, and 10) in conjunction with a MQW active-area 37B (FIGS. 7, 8, 9, and 10), which are both positioned between the FCSSL's previously mentioned two contact-layers 36, 38 (FIGS. 7, 8, 9, and 10) we create a double-heterostructure semiconductor folded cavity solid-state laser that will have lower current thresholds, lower internal heat, higher output gain, and smoother emission output.

Moreover, when the present invention uses the preferred double-heterostructure semiconductor (LED) "Light Emitting Diode" design as its source of fundamental optical radiation we create a folded cavity solid-state laser that generates an output emission that is greater than those produced by typical solid-state VCSEL diode laser designs used today. When the present invention uses the preferred double-heterostructure semiconductor (LED) "Light Emitting Diode" design as its source of fundamental optical radiation, because of the lower electrical resistance exhibited by its two graded confinement cladding-layers 37A, 37C (FIGS. 7, 8, 9, and 10) the FCSSL's active-region 37 (FIGS. 7, 8, 9, and 10) will produce less heat and, therefore a more effective output gain, which is greater than the output gain typically exhibited by prior-art solid-state VCSEL diode laser designs.

The preferred embodiment of the present invention as illustrated in FIGS. 7 and 8 (i.e., two three-dimensional isometric-views of the FCSSL, displaying numbered semiconductor multilayers), and FIGS. 9 and 10 (i.e., two sectional side view drawings) shows that the construction of a FCSSL begins with the creation of a FCSSL's first "200" nanometers thick contact-layer 36 (FIGS. 7, 8, 9, and 10), which is formed from a pre-manufactured and pre-sliced semiconductor wafer that was comprised from a seed crystal of highly +n-doped (GaAs) "Gallium-Arsenide" binary material having a crystallographic orientation of <100>, <111>, <110>, or <001>, a layer, which is also used as the FCSSL's main substrate for the subsequent growth of the FCSSL's remaining crystalline semiconductor layers. A FCSSL's first contact-layer 36, while providing negative electrical connectivity to the FCSSL's light emitting active-region 37 (FIGS. 7, 8, 9, and 10), will also enhance the reliability of the FCSSL's design, by preventing the migration of carrier-dislocations, and the like, to the FCSSL's active-area 37B (FIGS. 7, 8, 9, and 10).

In addition, and next in line for epitaxial deposition is a FCSSL's first "300" nanometers thick graded confinement cladding-layer 37A (FIGS. 7, 8, 9, and 10), which is deposited, using MBE or MOCVD, onto the top of the outermost surface of the FCSSL's first contact-layer 36, giving it the deposited position between the FCSSL's first contact-layer 36 and the FCSSL's active-area 37B. Moreover, a FCSSL's first graded confinement cladding-layer 37A (FIGS. 7, 8, 9, and 10) is comprised from a graded N-doped (GaAlAs) "Gallium-Aluminum-Arsenide" ternary material, where the concentration of "Gallium" gradient within the ternary material is gradually and smoothly increased starting from the first graded confinement cladding-layer's bottom outermost surface 37A, where the gradient is smoothly and continuously increased through the ternary material in a direction toward the FCSSL's active-area 37B (FIGS. 7, 8, 9, and 10) until the first graded confinement cladding-layer's top outer-most surface is reached. For example, starting from the first graded confinement cladding-layer's bottom outermost surface 37A the amount of "Gallium" gradient is gradually increased from GaO.55/Al/As, to GaO.60/Al/As, to GaO.65/Al/As, to GaO.70/Al/As, to GaO.75/Al/As, and finally to GaO.80/Al/As 37A.

While, in contradiction, the concentration of "Aluminum" gradient within the same ternary material is gradually and smoothly decreased starting from the first graded confinement cladding-layer's bottom outermost surface 37A (FIGS. 7, 8, 9, and 10), where the gradient is smoothly and continuously decreased through the ternary material in a direction toward the FCSSL's active-area 37B (FIGS. 7, 8, 9, and 10) until the first graded confinement cladding-layer's top outermost surface is reached. For example, starting from the first graded confinement cladding-layer's bottom outermost surface 37A the amount of "Aluminum" gradient is gradually decreased from Ga/AlO.45/As, to Ga/AlO.40/As, to Ga/AlO.35/As, to Ga/AlO.30/As, to Ga/AlO.25/As, and finally to Ga/AlO.p20/As 37A.

In addition, and layer next in line for deposition is a FCSSL's single active-area 37B (FIGS. 7, 8, 9, and 10), which constitutes the diode's active-medium. The diode's active-medium, through a process of stimulated emission, will amplified monochromic light; wherein, the active-medium is optically pumped by intra-cavity diode produced fundamental light, which was created by the populated inversion that occurs within the FCSSL's double-heterostructure diode when the diode's structure is electrically pumped. Where, the diode's active-medium could be described as being either configured as a simple structure comprising either a single bulk semiconductor layer, or a single quantum well semiconductor layer, or as multiple quantum well semiconductor layers having small forbidden bands, all in all structures that will define, upon their deposition, a FCSSL's active-area, which is simply an area, when constructed as one of the layered structures mentioned above, made optically active, and having a location within the FCSSL's active-region 37 (FIGS. 7, 8, 9, and 10), usually between the active-region's cladding-layers.

Moreover, a FCSSL's active-area 37B (FIGS. 7, 8, 9, and 10) as illustrated within the preferred embodiment is a multi-layered MQW structure positioned between the FCSSL's first 37A and second 37C (FIGS. 7, 8, 9, and 10) graded confinement cladding-layers. The previously mentioned multi-layered MQW structure comprises seven quantum wells 50A, 50B, 50C, 50D, 50E, 50F, 50G (FIG. 18B), which are constructed from a binary (GaAs) "Gallium-Arsenide" semiconductor material with a small forbidden band width, and six quantum well cladding-layers 51A, 51B, 51C, 51D, 51E, 51F (FIG. 15B), which are constructed from a ternary (GaAlAs) "Gallium-Aluminum-Arsenide" semiconductor material with a very large forbidden band width. Importantly, all thirteen of the previously mentioned semiconductor layers that comprise a FCSSL's active-area 37B (FIGS. 7, 8, 9, and 10), when combined, should form a MQW structure having a combined material thickness that is one-quarter of one wavelength of the fundamental light created by the FCSSL's active-region 37 (FIGS. 7, 8, 9, and 10).

For example, if a FCSSL's active-region 37 were designed to create a fundamental light emission with a wavelength of "800" nanometers, then the active-area's 37B (FIGS. 7, 8, 9, and 10) total material thickness would need to be one-quarter (i.e., "200" nanometers) of one wavelength of the fundamental "800" nanometer light created by the previously mentioned FCSSL's active-region 37. Therefore, the combined thickness'of the previously mentioned multiple quantum well layers and multiple quantum well cladding-layers that make up the FCSSL's active-area 37B (FIGS. 7, 8, 9, and 10) should have a total material thickness of "200" nanometers, or one-quarter of one wavelength of the fundamental "800" nanometer light created by the FCSSL's active-region 37.

Furthermore, if a FCSSL's active-area 37B (FIGS. 7, 8, 9, and 10) had seven quantum wells 50A, 50B, 50C, 50D, 50E, 50F, 50G (FIG. 18B) comprised from binary (GaAs) "Gallium-Arsenide" semiconductor material, the seven quantum wells 50A, 50B, 50C, 50D, 50E, 50F, 50G (FIG. 18B) would, each need to have a material thickness of about "10.30" nanometers. In addition, if a FCSSL's active-area 37B had six quantum well cladding-layers 51A, 51B, 51C, 51D, 51E, 51F (FIG. 18B) comprised from ternary (GaAlAs) "Gallium-Aluminum-Arsenide" semiconductor material, the six quantum well cladding-layers 51A, 51B, 5C, 51D, 51E, 51F (FIG. 18B) would, each need to have a material thickness of about "21.30" nanometers. The thickness amounts for each of the seven quantum wells and six quantum well cladding-layers located within the FCSSL's active-area 37B, when combined should have a total material thickness equal to "200" nanometers or one-quarter of one wavelength of the fundamental "800" nanometer light created by the FCSSL's active-region 37 (FIGS. 7, 8, 9, and 10).

In addition, the preferred embodiment of the present invention as illustrated in FIG. 17, from a quantum mechanical viewpoint, shows a typical FCSSL MQW structure diagrammatically characterized. More specifically, FIG. 17 illustrates a profile of the potential wells and the discreet energy levels assumed by the carriers respectively in the conduction and valency bands (i.e., respectively electrons and holes). When, an epitaxy, semiconductor film having a small forbidden band e2 (e.g., a film with a typical thickness of about ten nanometers), such as films 50A, 50B, 50C, 50D, 50E, 50F, 50G (FIG. 18B), which are surrounded by two films having a larger forbidden band e0 (e.g., a film with a typical thickness of about twenty nanometers), such as films 51A, 51B, 51C, 51D, 51E, 51F (FIG. 18B), the previously mentioned electrons and holes of the small forbidden band material 50A, 50B, 50C, 50D, 50E, 50F, 50G (FIG. 18B) are confined in monodirectional potential wells e2. Therefore, as illustrated in FIG. 17 the movement of an electron into a well created in the conduction band of height .DELTA.E.sub.c is quantified in discreet states of energy $E_1$, $E_2$, $E_3$, etc.; moreover, in the same way, the movement of a hole into a well created in the valency band of height .DELTA.E.sub.x is quantified in discreet states of energy $E'_1$, $E'_2$, and $E'_3$. When the thickness of the small forbidden bandwidth material e2 varies, the energy states assumed by the carriers also vary. Therefore, the emission length of the previously mentioned MQW structures can consequently be adjusted by the choice, the nature, and the thickness of the semiconductor material films used in their construction.

In addition, and next in line for deposition is a FCSSL's second "300" nanometers thick graded confinement cladding-layer 37C (FIGS. 7, 8, 9, and 10), which is deposited using MBE or MOCVD onto the top and outermost surface of the FCSSL's active-area 37B (FIGS. 7, 8, 9, and 10), giving it a deposited position between the FCSSL's active-area 37B and the FCSSL's second contact-layer 38 (FIGS. 7, 8, 9, and 10). A FCSSL's second graded confinement cladding-layer 37C (FIGS. 7, 8, 9, and 10) is comprised from a graded P-doped (GaAlAs) "Gallium-Aluminum-Arsenide" ternary semiconductor material, where the concentration of "Gallium" gradient within the ternary material is gradually and smoothly increased starting from the second graded confinement cladding-layer's top outermost surface 37C, where the gradient is smoothly and continuously increased through the ternary material in a direction toward the FCSSL's active-area 37B (FIGS. 7, 8, 9, and 10), until the second graded confinement cladding-layer's bottom outermost surface is reached.

For example, starting from the second graded confinement cladding-layer's top outermost surface 37C (FIGS. 7, 8, 9, and 10) the amount of "Gallium" gradient is gradually increased from Ga0.55/Al/As, to Ga0.60/Al/As, to Ga0.65/

Al/As, to Ga0.70/Al/As, to Ga0.75/Al/As, and finally to Ga0.80/Al/As 37C. While, in contradiction, the concentration of "Aluminum" gradient within the same ternary material is gradually and smoothly decreased starting from the second graded confinement cladding-layer's top outermost surface 37C, where the gradient is smoothly and continuously decreased through the ternary material in a direction toward the FCSSL's active-area 37B (FIGS. 7, 8, 9, and 10), until the second graded confinement cladding-layer's bottom outermost surface is reached. For example, starting from the second graded confinement cladding-layer's top outermost surface 37C the amount of "Aluminum" gradient is gradually decreased from Ga/Al0.45/As, to Ga/Al0.40/As, to Ga/Al0.35/As, to Ga/Al0.30/As, to Ga/Al0.25/As, and finally to Ga/Al0.20/As 37C.

In addition, and next in line for deposition is a FCSSL's second "200" nanometers thick contact-layer 38 (FIGS. 7, 8, 9, and 10), which is comprised from a highly +p-doped (GaAs) "Gallium-Arsenide" binary semiconductor material that is epitaxially grown onto the top and outermost surface of the FCSSL's second graded confinement cladding-layer 37C (FIGS. 7, 8, 9, and 10), giving it a deposited position between the FCSSL's second graded confinement cladding-layer 37C and the FCSSL's multilayered quarterwave mirror-stack assembly 39 (FIGS. 7, 8, 9, and 10). Moreover, a second contact-layer 38, while providing positive electrical connectivity to the FCSSL's active-region 37 (FIGS. 7, 8, 9, and 10), will also enhance the reliability of the FCSSL's laser design, by preventing the migration of carrier-dislocations, and the like, to the FCSSL's active-area 37B (FIGS. 7, 8, 9, and 10).

In addition, and next in line for deposition is a FCSSL's total internal reflecting corner-cube shaped polyhedral prism waveguide 35 (FIGS. 7, 8, 9, and 10), which, if comprised from an ion doped solid-state active-medium material like one of the following materials: YAG ($Y_3Al_5O_{12}$), LMA ($LaMgAl_{11}O_{19}$), $YVO_4$, YSO ($Y_2SiO_5$), YLF ($YLiF_4$), or $GdVO_4$, will internally reflect a "100" percent any wavelength of optical radiation that enters its plane-parallel, flat horizontal, and circular top front-face surface 35D (FIGS. 14A and 14B).

Figure 14A:
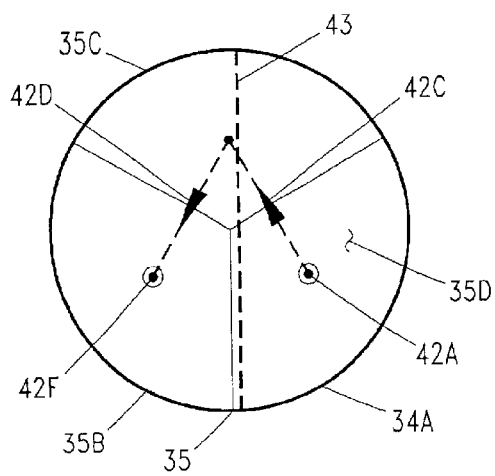
FIG. 14A shows an orthographic plan top-view drawing of the present invention's corner-cube shaped polyhedral prism waveguide, which displays the raytraced pathway of an internally reflected light-ray.
Figure 14B:
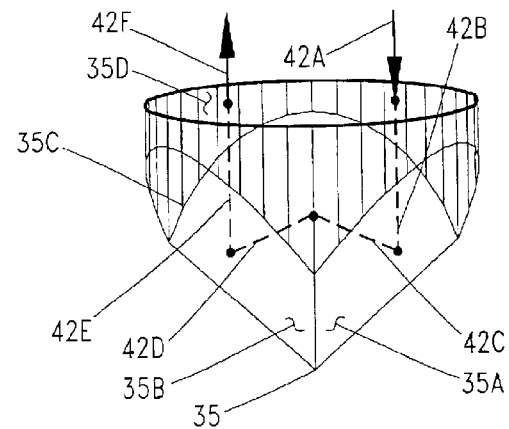
FIG. 14B shows a three-dimensional thirty-degree isometric top side-view of the present invention's corner-cube shaped polyhedral prism waveguide, which displays the raytraced pathway of an internally reflected light-ray.

Moreover, a FCSSL's corner-cube polyhedral prism waveguide is exactly what its name implies a polyhedral based prism waveguide having the shape of a cube's corner 35 (FIGS. 7, 8, 9, and 10), which is cut off orthogonal to one of its (i.e., body-diagonal) triad axes, where the resultant polyhedral prism waveguide's top plane-parallel and flat horizontal surface is as a result formed into a planar-flat and circular surface 35D (FIGS. 14A and 14B). As a result, a FCSSL's corner-cube polyhedral prism waveguide's three polyhedral prisms 35A, 35B, 35C (FIGS. 14A and 14B) will redirect internally any incoming light-rays 42A (FIGS. 14A and 14B) a "180" degrees backwards toward their original direction and light source, no matter what the light-rays' angle of incidence was when it entered the corner-cube polyhedral prism waveguide's plane-parallel, flat horizontal, and circular top front-face surface 35D; wherein, an internally reflected light-ray is shifted laterally by an amount that depends upon the light-ray's point of entry.

Furthermore, a FCSSL's corner-cube polyhedral prism waveguide 35, as illustrated in FIG. 14A (i.e., isometric three-dimensional-view) is displayed as a three-dimensional object that shows the corner-cube polyhedral prism waveguide with a raytraced pathway for a single incoming 42A (FIG. 14A) and outgoing 42F (FIG. 14A) light-ray that is incidental upon the corner-cube polyhedral prism waveguide's plane-parallel, flat horizontal, and circular top front-face surface 35D. A FCSSL's corner-cube polyhedral prism waveguide 35, as illustrated in FIG. 14B (i.e., an orthographic top plan-view) is displayed as a three-dimensional object that shows the corner-cube polyhedral prism waveguide with a ray-traced pathway for a single incoming 42A (FIG. 14B) and outgoing 42F (FIG. 14B) light-ray that is incidental upon the corner-cube polyhedral prism waveguide's plane-parallel, flat horizontal, and circular top front-face surface 35D (FIG. 14B). The main function of illustrations FIGS. 14A and 14B is to describe, through the use of two simple geometric diagrams, how light-rays 42A when entering a FCSSL corner-cube polyhedral prism waveguide's plane-parallel, flat horizontal, and circular top front-face surface 35D are internally redirected a "180" degrees backwards toward their originating light source 42F.

Moreover, when a light-ray 42A (FIGS. 14A and 14B) enters the plane-parallel, flat horizontal, and circular top front-face surface 35D (FIGS. 14A and 14B) of a FCSSL's corner-cube polyhedral prism waveguide 35 (FIGS. 14A and 14B) it will first travel to one of the corner-cube polyhedral prism waveguide's three internal polyhedral prism facets, which are located in the waveguide's polyhedral shaped base 35A, 35B, 35C, where it 42B will be redirected 42C a "100" percent from a first internal polyhedral prism facet-face 35A, to a second internal polyhedral prism facet-face 35C, where it will be redirected 42D a "100" percent to a third internal polyhedral prism facet-face 35B (FIGS. 14A and 14B), where it 42E will be redirected a "100" percent up and out of the FCSSL's corner-cube polyhedral prism waveguide's plane-parallel, flat horizontal, and circular top front-face surface 35D backwards 42F into the FCSSL's vertical cavity for further amplification.

Figure 2:
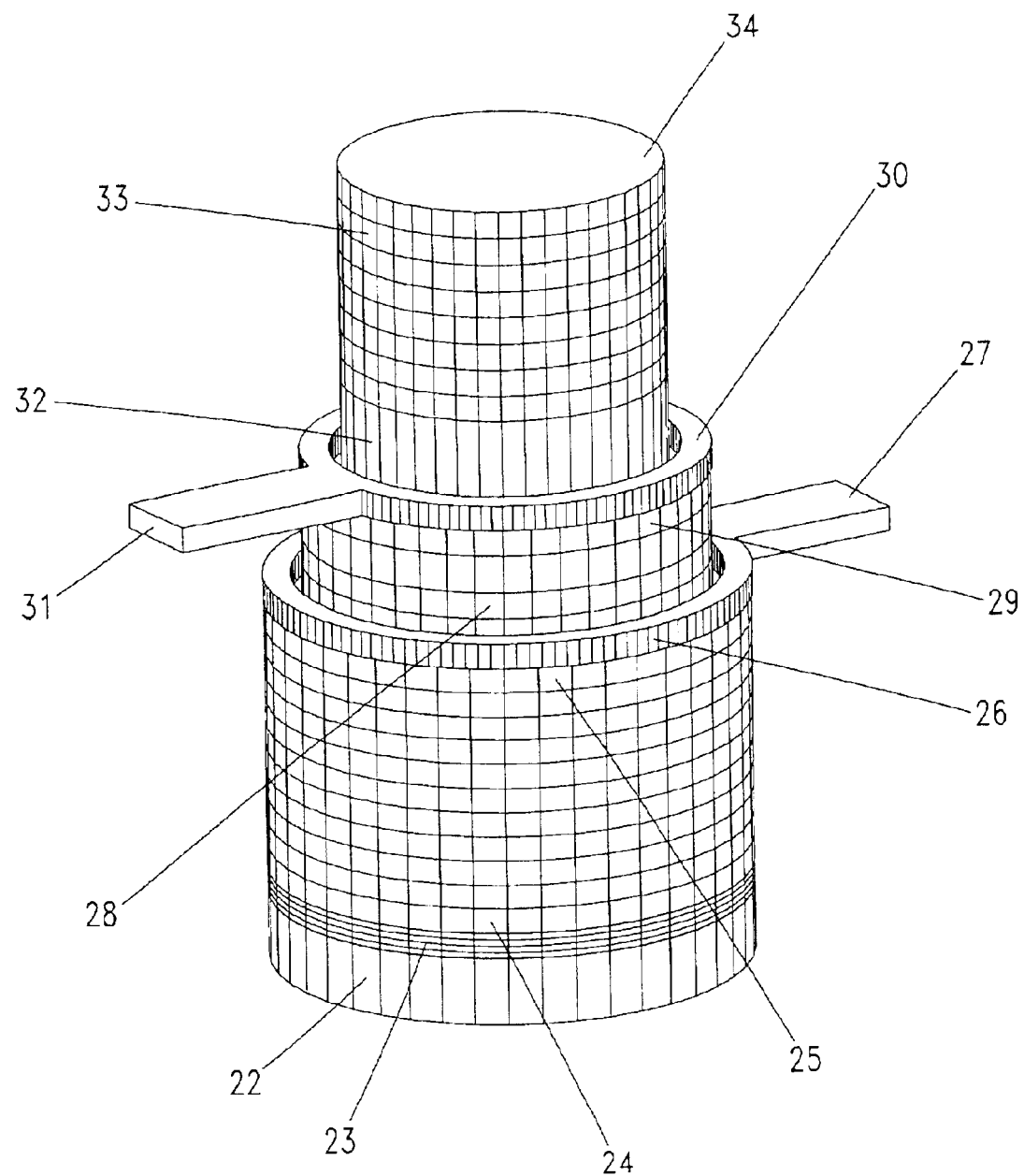
FIG. 2 shows prior art, illustrated as a three-dimensional thirty-degree isometric top front-view drawing of a solid-state VCSEL diode laser, which displays a multilayered structure comprising a substrate-layer, a first quarter-wave mirror-stack assembly, an active-region, a laser-active layer, a second quarterwave mirror-stack assembly, and an emitter-layer.
Figure 3:
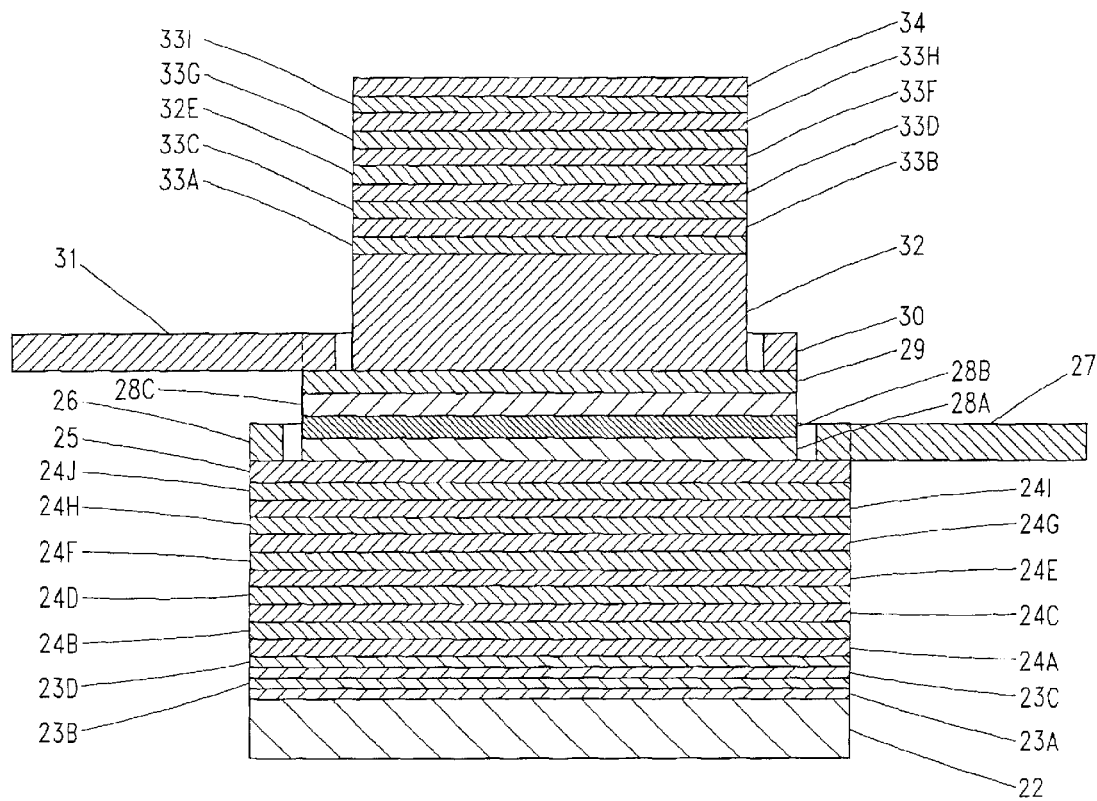
FIG. 3 shows prior art, illustrated as an orthographic vertical-section side-view drawing of a solid-state VCSEL diode laser, which displays a multilayered structure comprising a substrate-layer, a first quarterwave mirror-stack assembly, an active-region, a laser-active layer, a second quarterwave mirror-stack assembly, and an emitter-layer.
Figure 4:
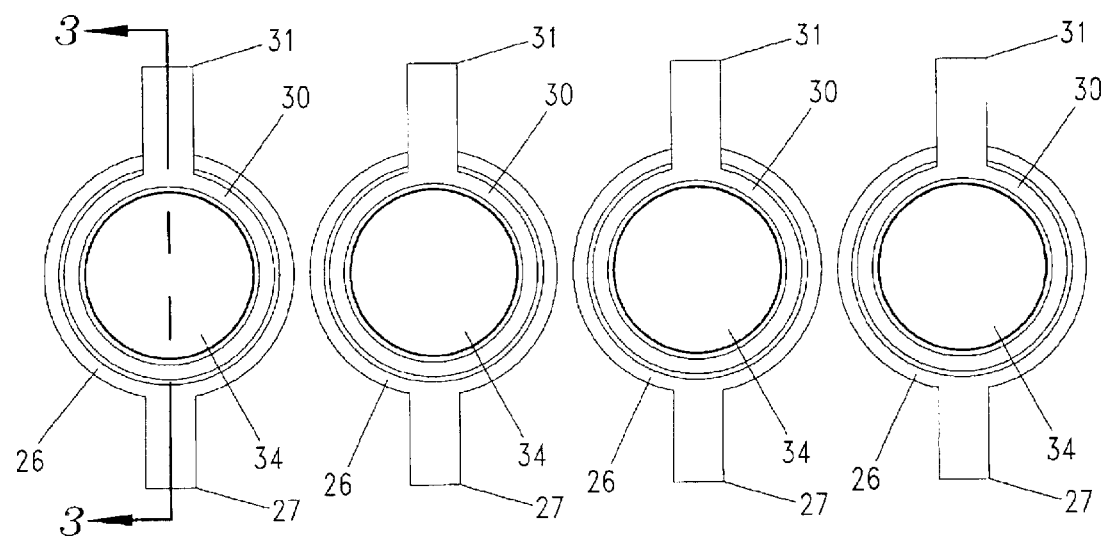
FIG. 4 shows prior art, illustrated as an orthographic top plan-view drawing, which displays a linear array of four solid-state VCSEL diode laser's, while showing section line 3—3.
Figure 5:
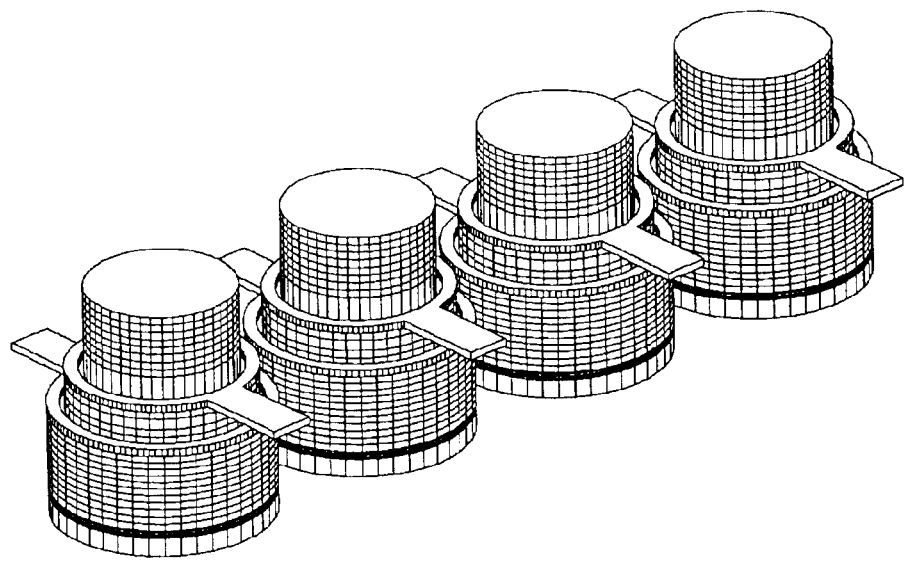
FIG. 5 shows prior art, illustrated as a three-dimensional isometric top-right side-view drawing of four solid-state VCSEL diode lasers, which are shown in a linear array configuration.
Figure 6:
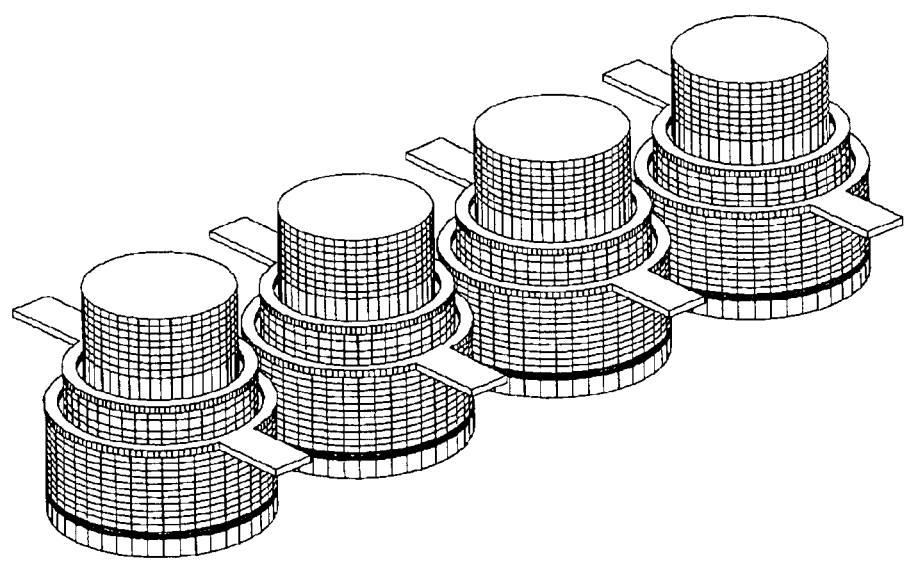
FIG. 6 shows prior art, illustrated as a three-dimensional isometric top-left side-view drawing of four solid-state VCSEL diode lasers, which are shown in a linear array configuration.

In addition, the preferred embodiment of the present invention as illustrated in FIGS. 7, 8, 9, 10, 11, 12, and 13 shows that a polyhedral prism waveguide 35 (FIGS. 14A and 14B), 44 (FIGS. 15A and 15B), 47 (FIGS. 16A and 16B) has replaced what is typically known in prior-art solid-state VCSEL diode laser design as the first or base quarterwave mirror-stack assembly. Typically, as illustrated in FIGS. 7, 8, 9, 10, 11, 12, and 13, a MBE or MOCVD epitaxial deposition of a base quarterwave mirror-stack assembly 24 (FIGS. 1, 2, and 3) made from materials like (AlN) "Aluminum-Nitride" and (GaN) "Gallium-Nitride" (AlGaN) "Aluminum-Gallium-Nitride can occur only after a crystal growing buffer-layer 23 (FIGS. 1, 2, and 3) of (AlN) "Aluminum-Nitride" is epitaxially deposited onto the top and outermost surface of the metallic supporting substrate 22 (FIGS. 1, 2, and 3). However, by using a polyhedral prism waveguide 35, 44, 47 made from YAG ($Y_3Al_5O_{12}$), LMA ($LaMgAl_{11}O_{19}$), $YVO_4$, YSO ($Y_2SiO_5$), YLF ($YLiF_4$), or $GdVO_4$ in place of the more typical quarterwave mirror-stack assembly normally used in solid-state VCSEL diode laser design the need for material buffering layers is eliminated.

Furthermore, the location of a FCSSL's polyhedral prism waveguide is at the base of the FCSSL's folded vertical cavity; thereby, replacing the more conventional metallic alloy and/or sapphire substrates 22 (FIGS. 1, 2, and 3) and the planar-flat multilayered quarterwave mirror-stack assemblies 24 (FIGS. 1, 2, and 3) that are normally used in prior-art solid-state VCSEL diode laser designs, with a single layered monolithic structure 35, 44, 47, which is made from made from a solid-state laser-active material like YAG ($Y_3Al_5O_{12}$), LMA ($LaMgAl_{11}O_{19}$), $YVO_4$, YSO ($Y_2SiO_5$), YLF (YLiF.sub.4), or GdVO.sub.4, or some other optically active material that transmits and/or amplifies the desired frequencies of optical radiation. Furthermore, unlike the quarterwave mirror-stack assemblies normally used in prior-art solid-state VCSEL diode laser designs, the polyhedral prism waveguides used in FCSSLs are monostructural (i.e., formed into a single shape from a single material) polyhedrons, which tend to be geometrically complex, but structurally simply, as opposed to the previously mentioned quarterwave mirror-stack assemblies 24 (FIGS. 1, 2, and 3) used in prior-art solid-state VCSEL diode laser design's, which tend to be geometrically simple, but structurally complex being comprised as multilayered structures having a multitude of thin-film planar-flat plates constructed from materials having alternate refractive indices.

Moreover, a FCSSL's monostructural polyhedral prism waveguide 35, 44, 47 when constructed from YAG (Y.sub.3 Al.sub.5 O.sub.12), LMA (LaMgAl.sub.11 O.sub.19), YVO.sub.4, YSO (Y.sub.2 SiO.sub.5), YLF (YLiF.sub.4), or GdVO.sub.4 are inexpensive to manufacture, are moisture resistant, are heat resistant, are non-conducting, and are easy to use in the construction of the before mentioned FCSSLs. Also, the previously mentioned YAG (Y.sub.3 Al.sub.5 O.sub.12), LMA (LaMgAl.sub.11 O.sub.19), YVO.sub.4, YSO (Y.sub.2 SiO.sub.5), YLF (YLiF.sub.4), or GdVO.sub.4 material is amorphous (i.e., a material made up of molecules that lack a distinct crystalline structure); therefore, the material also has an absolute lattice-mismatch to semiconductor materials like (GaAs) "Gallium-Arsenide" and (AlGaAs) "Aluminum-Gallium-Arsenide, and to other Zinc-blend semiconductor materials used in the construction of active-region layers, which tends to promote a greater reflectivity at the material interface that lies between a FCSSL's first contact-layer 36 (FIGS. 7, 8, 9, and 10) and the FCSSL's polyhedral prism waveguide 35, 44, 47.

In addition, a FCSSL's polyhedral prism waveguide would also be optically transparent, optically transmitting, and optically reflective to all intracavity produced optical radiation with wavelengths ranging from the very-short "150" nanometers of ultraviolet radiation to the very-long "5000" nanometers of infrared radiation. Remembering, that it is the before mentioned polyhedral prism waveguide's monostructural geometry that gives it the ability to internally redirect all optical radiation that enters its plane-parallel, flat-horizontal, and circular top front-face surface 35D (FIGS. 14A and 14B), 44C (FIGS. 15A and 15B), 47B (FIGS. 16A and 16B).

Furthermore, the FCSEL design increases its modal discrimination and its output gain by extending its opticalcavity length using the polyhedral prism waveguide that is constructed using a laser-active light amplifying material like YAG (Y.sub.3 Al.sub.5 O.sub.12), LMA (LaMgAl.sub.11 O.sub.19), YVO.sub.4, YSO (Y.sub.2 SiO.sub.5), YLF (YLiF.sub.4), or GdVO.sub.4 as the means. The previously mentioned polyhedral prism waveguide, because it lengthens a FCSEL's optical-cavity, works by increasing the diffraction loss for its higher-order transverse optically moded light; thus increasing gain for its fundamental and lower-order transverse optically moded light. Therefore, by replacing the bottom positioned multilayered quarterwave mirror-stack assembly, so typical of solid-state VCSEL diode laser designs, with a polyhedral prism waveguide constructed using YAG (Y.sub.3 Al.sub.5 O.sub.12), LMA (LaMgAl.sub.11 O.sub.19), YVO.sub.4, YSO (Y.sub.2 SiO.sub.5), YLF (YLiF.sub.4), or GdVO.sub.4 we increase the output for its fundamental singletransverse optically moded light emission to nearly "100" milliwatts.

FIGS. 14, 15, 16, 17, 19, and 20—Additional Embodiments

Additional embodiments as illustrated in FIGS. 14, 15, 16, 17, 19, and 20 shows two different and additional embodiments of a FCSSL's polyhedral prism waveguide which, if comprised from an ion doped solid-state activemedium material like one of the following materials: YAG (Y.sub.3 Al.sub.5 O.sub.12), LMA (LaMgAl.sub.11 O.sub.19), YVO.sub.4, YSO (Y.sub.2 SiO.sub.5), YLF (YLiF.sub.4), or GdVO.sub.4, the waveguide will amplify while reflecting internally a "100" percent the optical radiation that enters their plane-parallel, flat horizontal, and circular top front-face surfaces 35D (FIGS. 14A and 14B), 44C (FIGS. 15A and 15B), 47B (FIGS. 16A and 16B). Moreover, the first additional embodiment as illustrated in FIGS. 15A and 15B shows a FCSSL's right-angle prism shaped polyhedral prism waveguide. Wherein, FIG. 15A (i.e., an isometric three-dimensional-view) displays an isometric three-dimensional-view drawing of a FCSSL's rightangle prism shaped polyhedral prism waveguide 44 along with a raytraced pathway for an incoming 45A and outgoing 45E light-ray that is incidental upon the right-angle prism shaped polyhedral prism waveguide's plane-parallel, flat horizontal, and circular top front-face surface 44C (FIG. 15A).

Figure 15A:
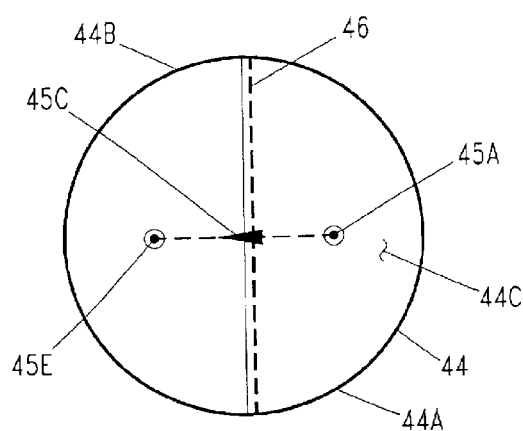
FIG. 15A shows an orthographic plan top-view of the present invention's right angle shaped polyhedral prism waveguide, which displays the raytraced pathway of an internally reflected light-ray.
Figure 15B:
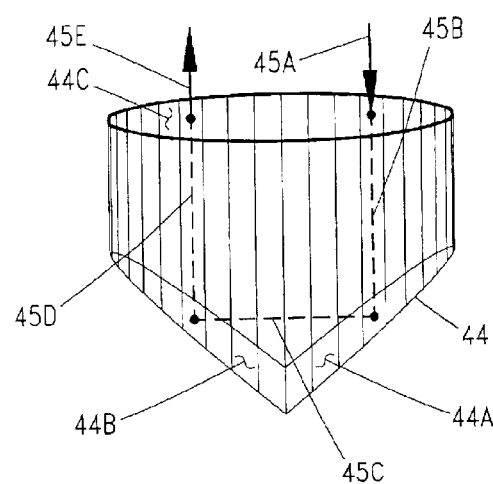
FIG. 15B shows a three-dimensional isometric top side-view of the present invention's right angle shaped polyhedral prism waveguide, which displays the raytraced pathway of an internally reflected light-ray.

In addition, FIG. 15B (i.e., an orthographic top plan-view) displays an orthographic plan-view drawing of a FCSSL's right-angle prism shaped polyhedral prism waveguide 44 along with a raytraced pathway for an incoming 45A and outgoing 45E light-ray that is incidental upon of the FCSSL's right-angle prism shaped polyhedral prism waveguide's top plane-parallel, flat horizontal, and circular front-face surface 44C (FIG. 15B). The main function of illustrations like FIGS. 15A and 15B is to describe, through the use of two simple geometric diagrams, how light-rays 45 (FIGS. 15A and 15B), when they enter a FCSSL's rightangle prism shaped polyhedral prism waveguide's planeparallel, flat horizontal, and circular top front-face surface 44C (FIGS. 15A and 15B) are internally reflected a "180" degrees backwards toward their originating light source 45E (FIGS. 15A and 15B). Moreover, when a light-ray 45A (FIGS. 15A and 15B) enters the plane-parallel, flat horizontal, and circular top front-face surface 44C (FIGS. 15A and 15B) of a FCSSL's right-angle prism shaped polyhedral prism waveguide 44 it will first travel to one of the waveguide's two internal polyhedral prism facet-faces, which are located in the waveguide's polyhedral shaped base 44A, 44B (FIGS. 15A and 15B), where it 45B (FIGS. 15A and 15B) will be redirected 45C (FIGS. 15A and 15B) a "100" percent into a "90" degree transverse direction from a first internal polyhedral prism facet-face 44A (FIGS. 15A and 15B), to a second internal polyhedral prism facet-face 44B (FIGS. 15A and 15B), where it will be redirected 45D (FIGS. 15A and 15B) a "100" percent into a "90" degree longitudinal direction up and out of the plane-parallel, flat horizontal, and circular top front-face surface 44D (FIGS. 15A and 15B) of the right-angle prism shaped polyhedral prism waveguide, backwards into the FCSSL's vertical cavity 45E (FIGS. 15A and 15B) for further amplification and emission.

The second additional embodiment, as illustrated in FIGS. 16A and 16B shows a conical shaped polyhedral prism waveguide 47 which, if comprised from an ion doped solid-state active-medium material like one of the following materials: YAG (Y.sub.3 Al.sub.5 O.sub.12), LMA (LaMgAl.sub.11 O.sub.19), YVO.sub.4, YSO (Y.sub.2 SiO.sub.5), YLF (YLiF.sub.4), or GdVO.sub.4, will reflect internally a "100" percent any wavelength of optical radiation that enters its plane-parallel, flat horizontal, and circular top front-face surface 47B (FIGS. 16A and 16B). FIG. 16A (i.e., an isometric three-dimensional-view) displays an isometric three-dimensional-view of a conical shaped polyhedral prism waveguide 47 along with a raytraced pathway for an incoming 48A and outgoing 48E light-ray that is incidental upon the conical shaped polyhedral prism waveguide's plane-parallel, flat horizontal, and circular top front-face surface 47B (FIG. 16A).

In addition, FIG. 16B (i.e., an orthographic top plan-view) displays an orthographic plan-view of a conical shaped polyhedral prism waveguide 47 along with a raytraced pathway for an incoming 48A and outgoing 48E light-ray that is incidental upon of the conical shaped polyhedral prism waveguide's top plane-parallel, flat horizontal, and circular front-face surface 47B (FIG. 16B). The main function of the illustrations in FIGS. 16A and 16B is to describe, through the use of two simple geometric diagrams, how light-rays 48 (FIGS. 16A and 16B), when they enter a FCSSL's conical shaped polyhedral prism waveguide's plane-parallel, flat horizontal, and circular top front-face surface 47B (FIGS. 16A and 16B) are internally reflected a "180" degrees backwards toward their originating light source 48E (FIGS. 16A and 16B).

Moreover, when a light-ray 48A (FIGS. 16A and 16B) enters the plane-parallel, flat horizontal, and circular top front-face surface 47B (FIGS. 16A and 16B) of a FCSSL's conical shaped polyhedral prism waveguide 47 (FIGS. 16A and 16B) it will first travel to the conical shaped polyhedral prism waveguide's single curved polyhedral prism facet-face 47A (FIGS. 16A and 16B), which is located at the waveguide's bottom 47A (FIGS. 16A and 16B), where it 48B (FIGS. 16A and 16B) will be redirected 48C (FIGS. 16A and 16B) a "100" percent into a "90" degree transverse direction from the curved internal polyhedral prism facet-face 47A (FIGS. 16A and 16B) to the other side of the curved internal polyhedral prism facet-face 47A (FIGS. 16A and 16B) where it will be redirected 48D (FIGS. 16A and 16B) a "100" percent into a "90" degree longitudinal direction, which is up and out of the FCSSL's conical shaped polyhedral prism waveguide's plane-parallel, flat horizontal, and circular top front-face surface 45B (FIGS. 16A and 16B) backwards into the FCSSL's vertical cavity for further amplification.

An additional embodiment of the present FCSSL invention, as illustrated in FIGS. 11, 12, 13, 14, 15, 16, and 17 is a material distribution process used for the polyhedral prism waveguides 35, 44, 47 (FIGS. 14A, 14B, 15A, 15B, 16A, and 16B). When constructed from an ion doped solid-state active-medium material like one of the following materials: YAG ($Y_3Al_5O_{12}$), LMA ($LaMgAl_{11}O_{19}$), $YVO_4$, YSO ($Y_2SiO_5$), YLF ($YLiF_4$), or $GdVO_4$, the previously mentioned polyhedral prism waveguides are to be sputter deposited (i.e., a well known process of ion-sputtering) onto the bottom and outermost surface of the FCSSL's first +n-doped (GaAs) "Gallium-Arsenide" crystalline semiconductor contact-layer 36 (FIGS. 7, 8, 9, and 10), while the contact-layer's 36 top and outermost surface will be used as a crystal growing substrate used to grow the FCSSL's remaining crystalline semiconductor structures using MBE or MOCVD as the preferred method of their layered deposition.

Furthermore, the reason why the top and outermost surface of a FCSSL's first +n-doped (GaAs) "Gallium-Arsenide" crystalline semiconductor contact-layer 36 (FIGS. 7, 8, 9, and 10) is used as the crystal growing substrate for growing the FCSSL's remaining crystalline semiconductor structures is that even though the polyhedral prism waveguide layer is deposited at the very bottom of a FCSSL's optical cavity it cannot be used as crystal growing substrate. This is because the ion doped solid-state active-medium materials like one of the following materials: YAG ($Y_3Al_5O_{12}$), LMA ($LaMgAl_{11}O_{19}$), $YVO_4$, YSO ($Y_2SiO_5$), YLF ($YLiF_4$), or $GdVO_4$ are "amorphous" and therefore can never be used to grow the FCSSL's succeeding layers of crystalline semiconductor materials. To explain this further, ion doped solid-state active-medium material like one of the following materials: YAG ($Y_3Al_5O_{12}$), LMA ($LaMgAl_{11}O_{19}$), $YVO_4$, YSO ($Y_2SiO_5$), YLF ($YLiF_4$), or $GdVO_4$ can never be used as a growth substrate for a MBE or MOCVD epitaxial deposition of a FCSSL's succeeding layers of crystalline semiconductor materials because, during the process of MBE or MOCVD deposition, a deposited material, during its growth, will take on the same crystalline or non-crystalline molecular structure that is exhibited by its crystal growing substrate. Consequently, because a FCSSL's polyhedral prism waveguides 35 (FIGS. 14A and 14B), 44 (FIGS. 15A and 15B), 47 (FIGS. 16A and 16B) as defined within this additional embodiment are made from an ion doped solid-state active-medium material like one of the following materials: YAG ($Y_3Al_5O_{12}$), LMA ($LaMgAl_{11}O_{19}$), $YVO_4$, YSO ($Y_2SiO_5$), YLF ($YLiF_4$), or $GdVO_4$ therefore, any crystalline semiconductor material, if epitaxially deposited upon an amorphous structure would, during its growth, acquire the ion doped solid-state active-medium material's amorphous non-crystalline structure and because the FCSSL's succeeding layers of diode constructing material need to have a crystalline structure in order to function, materials like one of the following materials: YAG ($Y_3Al_5O_{12}$), LMA ($LaMgAl_{11}O_{19}$), $YVO_4$, YSO ($Y_2SiO_5$), YLF ($YLiF_4$), or $GdVO_4$ are useless as construction materials used in the crystal growing production of double-heterostructure light emitting diodes, crystalline quarterwave mirror-stacks, and other crystalline structures that might be used to control the polarization, the modulation, and the frequency of the FCSSL's output emissions.

Furthermore, the distribution of ion doped solid-state active-medium materials like one of the following materials: YAG ($Y_3Al_5O_{12}$), LMA ($LaMgAl_{11}O_{19}$), $YVO_4$, YSO ($Y_2SiO_5$), YLF ($YLiF_4$), or $GdVO_4$, if used in the construction of a FCSSL's polyhedral prism waveguides 35 (FIGS. 14A and 14B), 44 (FIGS. 15A and 15B), 47 (FIGS. 16A and 16B), would be executed using a well known ion-sputtering process to deposit onto the bottom and outermost planar-flat surface that underlies the FCSSL's first contact-layer 36 (FIGS. 7, 8, 9, and 10) and crystal growing substrate of +n-doped binary (GaAs) "Gallium-Arsenide" material. For example, a layer of ion doped solid-state active-medium material, like one of the following materials: YAG ($Y_3Al_5O_{12}$), LMA ($LaMgAl_{11}O_{19}$), $YVO_4$, YSO ($Y_2SiO_5$), YLF ($YLiF_4$), or $GdVO_4$, approximately "1000" nanometers thick, is sputter deposited onto the bottom and outermost surface of a FCSSL's first contact-layer 36 (FIGS. 7, 8, 9, and 10) and crystal growing substrate of +n-doped binary (GaAs) "Gallium-Arsenide" material. Afterwards, lithography processes are used to remove the excess ion doped solid-state active-medium material that surrounds a FCSSL's polyhedral prism waveguide(s), revealing therein, a cylindrical shaped base-structure(s).

In addition, a well known ion-milling process is employed to slice out the polyhedral prism waveguide(s) 35 (FIGS. 14A and 14B), 44 (FIGS. 15A and 15B), 47 (FIGS. 16A and 16B) polyhedral prism facets, while an optical material like (LiF) "Lithium-Fluoride" 41 (FIGS. 7, 8, 9, and 10), having a very low index of refraction is deposited, using a well known ion sputtering process, is sputter deposited around the FCSSL's polyhedral prism waveguide(s). If necessary the (LiF) "Lithium-Fluoride" 41 (FIGS. 7, 8, 9, and 10) optical cladding material can be partially removed later using a well known ion-milling process, leaving the polyhedral prism waveguide's facets uncovered. The amorphous form of the before mentioned (LiF) "Lithium-Fluoride" cladding material 41 (FIGS. 7, 8, 9, and 10), while used as optical cladding material by a FCSSL's optical cavity, will also add support and structural strength to the FCSSL's polyhedral prism waveguide(s) 35 (FIGS. 14A and 14B), 44 (FIGS. 15A and 15B), 47 (FIGS. 16A and 16B) as well.

Furthermore, it should be understood that within each FCSSL device the thickness and doping levels of dopants within each layer is precisely controlled. Any deviation from a FCSSL's designed parameters, no matter how slight, would affect the FCSSL's performance (i.e., frequency range and flux intensity). For example, if a FCSSL device were designed to emit light at a wavelength of around "800" nanometers the thickness of each alternating layer used in the FCSSL's active-region 37 (FIGS. 7, 8, 9, and 10) would, typically each need to equal one-quarter of one wavelength of the fundamental "800" nanometer light produced by the FCSSL's active-region. The doping of a FCSSL's multi-layered structures is accomplished by the addition of various dopant materials (e.g., n-type electron donating dopants like Phosphorus and p-type electron accepting dopants like Boron) to the material layers that make-up each FCSSL device. Typically, dopant material can be added during the MBE or MOCVD epitaxial process of material deposition. A FCSSL device will use many different dopant concentrations of specific dopant materials within the several different extrinsic semiconductor layers that make-up the FCSSL's various multi-layered structures.

An additional embodiment of the present FCSSL invention as illustrated by FIGS. 7, 8, 9, 10, 11, 12, and 13 is the FCSSL device configured as a single folded cavity solid-state laser. For example, a FCSSL could be configured as a folded cavity solid-state laser device that is used in hardware applications like:

(i) In (AV) "Audio Video" record/playback multi-media recorders.

(ii) In (DVD) "Digital Video Disk" players.

(iii) In (CD) "Compact Disk" players.

(iv) In (WORM) "Write Once Read Many" data-storage devices constructed using single FCSSL diodes.

(v) In (MPEG) "Motion Picture Expert Group" compact disk players and recorders constructed using single FCSSL diodes.

(vi) In (MD) "Mini Disk" magneto-optical record/playback recorders.

(vii) In rear-projection big-screen television.

(viii) In magneto-optical flying-head data-storage hard disk drives.

(ix) In (DVD) "Digital Video Disk" ram-disk data-storage drives.

(x) In (MO) "Magneto Optical" removable disk drive mass-storage.

(xi) In a fiber optic gyroscope.

(xii) In short-haul and long-haul fiber-optic communication transmitters.

An additional embodiment of the present FCSSL invention as illustrated by FIGS. 7, 8, 9, 10, 11, 12, and 13 is the FCSSL device configured as a folded cavity solid-state laser. For example, a FCSSL could be configured as a folded cavity solid-state laser-array device that is used in hardware applications like:

(i) In optically pumped solid-state lasers using a FCSSL laser-array.

(ii) In video-display micro-screens using a FCSSL laser-array.

(iii) In flatbed and hand-held scanners using a FCSSL laser-array.

(iv) In laser printers using a FCSSL laser-array.

Figure 12:
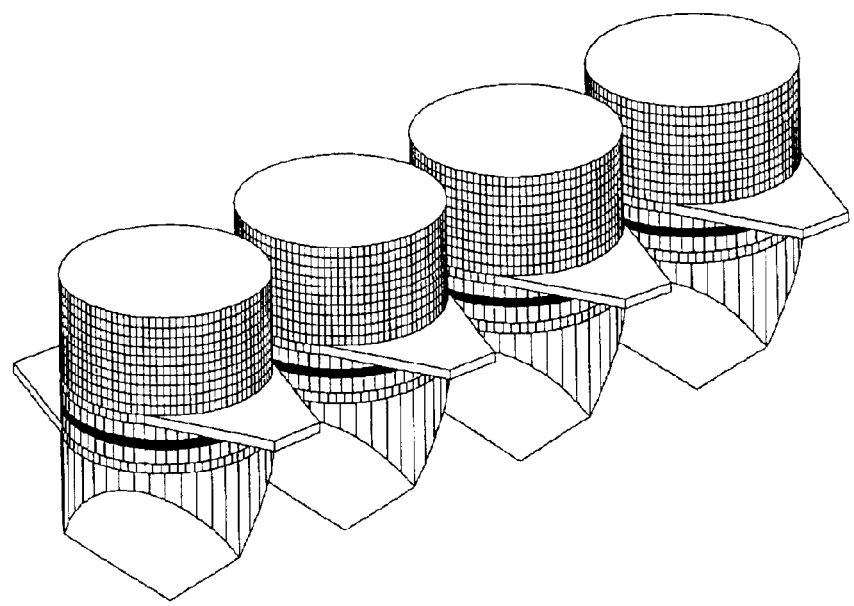
FIG. 12 shows the present invention, illustrated as a three-dimensional isometric top-right view drawing of four FCSSLs, which are shown in a linear array configuration.
Figure 13:
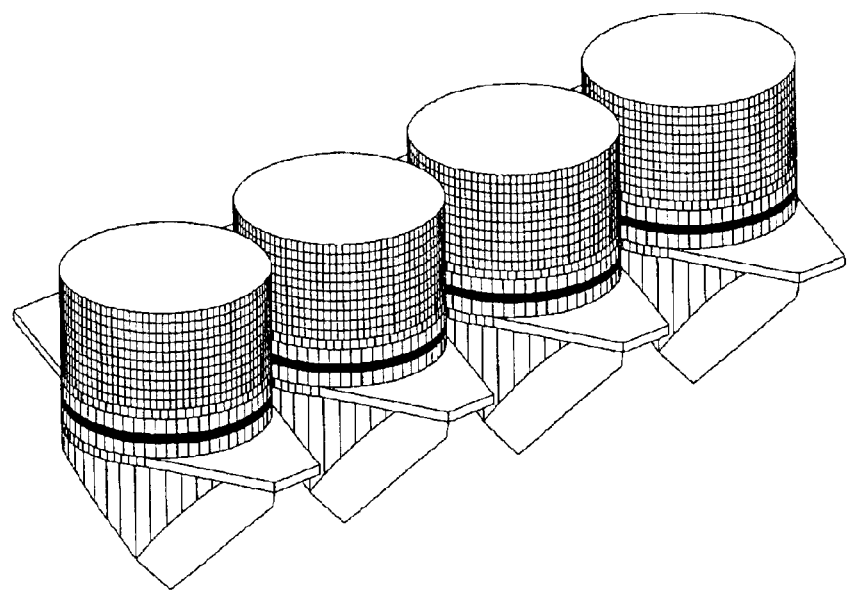
FIG. 13 shows the present invention, illustrated as a three-dimensional isometric top-left view of four FCSSLs, which are shown in a linear array con-figuration.

An additional embodiment of the present FCSSL invention describes how FCSSLs as illustrated by FIGS. 12 and 13 are configured as laser-arrayed devices, which are manufactured at the same time and from the same binary (GaAs) "Gallium-Arsenide" semiconductor substrate material that is used to construct the laser-array's control-circuitry, all of which, would be contained within a single integrated circuit semiconductor chip device. Wherein, the individual FCSSL lasers located within a single laser-array device would be configured as singularly controlled and addressable lasers or configured as a single laser-array device that is controlled as a single unit of lasers (i.e., a laser-array). The electronic control over both single FCSSL laser-array devices or individual FCSSL lasers that are located within a single FCSSL laser-array is easily accomplished through a (GaAs) "Gallium-Arsenide" semiconductor based control-bus, memory-bus, and address-bus form of circuitry, all of which are semiconductor circuits created from and contained on the same semiconductor substrate material used to create the individual FCSSL lasers or laser-array devices themselves. To explain further, (GaAs) "Gallium-Arsenide" circuitry can be created, along with the before mentioned FCSSL lasers or laser-array devices from the same binary (GaAs) "Gallium-Arsenide" semiconductor substrate material. Integrating the before mentioned FCSSL lasers or laser-array devices along with the before mentioned, control circuitry into a single surface mountable integrated semiconductor chip device.

An additional embodiment of the present FCSSL invention as illustrated by FIGS. 9 and 10 shows the addition of a optical cladding material to the vertical and outermost wall surfaces of vertical cavity or cavities 41 of FCSSL(s), where the optical cladding material has a refractive index less than the semiconductor crystalline materials used in the construction of FCSSL vertical cavity(s). An optical cladding material 41 (FIGS. 9 and 10) is to be deposited around and between every lithographically or ion-etched FCSSL; surrounding every outermost wall-surface of every FCSSL with an internal reflectivity that is "100" percent for any intra-cavity traveling light-ray, but only if the light-ray's angle of incidence upon the cladding-layer's 41 innermost wall surface has an internal angle of incidence equal to or greater than what is normally termed as the critical angle of internal reflection.

For example, the deposition of (LiF) "Lithium-Fluoride" 41 (FIGS. 9 and 10), an optical material, which possesses a much lower refractive index than the binary (GaAs) "Gallium-Arsenide" and the ternary (GaAlAs) "Gallium-Aluminum-Arsenide" materials used in the construction of a FCSSL's vertical cavity. Wherein, the previously mentioned (LiF) "Lithium-Fluoride" is used as an optical cladding material, which is sputter deposited onto and around the outermost wall surfaces 41 (FIGS. 9 and 10) of a FCSSL's vertical cavity; excluding the FCSSL's "200" nanometers thick emitter-layer 40 (FIGS. 9 and 10) which, being the last deposited layer in a FCSSL device it is located at the very top of the FCSSL's before mentioned active-region 37 (FIGS. 9 and 10). The deposition of optical cladding material to the FCSSLs'outer-most wall surfaces will give added stability to the FCSSLs and their polyhedral prism waveguides, while helping to achieve a total internal reflectivity for the FCSSLs themselves. The introduction of vertically applied internal reflectivity will help reduce optical loses to a FCSSL's optical cavity; wherein, the previously mentioned optical loses being what is normally caused by planar-mirror light-scattering and planar-mirror diffraction scattering.

Moreover, the application of optical cladding materials like (LiF) "Lithium-Fluoride" to the optical cavities of FCSSLs 41 (FIGS. 9 and 10), will create between the optical cavities of FCSSLs and the previously mentioned optical cladding material, an internal reflecting optical-barrier, which will confine to a FCSSL's optical cavity, diode produced fundamental light. This process works in much the same way as fiber-optic technology does. Wherein, an optical cladding material having an lower refractive index than the material used within an optical fiber's core is deposited onto the outer-most surface walls of that optical fiber's core, will achieve, a "100" percent, total internal reflectivity for any intra-fiber traveling light-ray whose angle of incidence upon the innermost wall surface of optical-fiber's cladding-layer has an internal angle of incidence equal to or greater than what is normally termed as the critical angle of internal reflection.

FIG. 23—Alternative Embodiment

Figure 19:
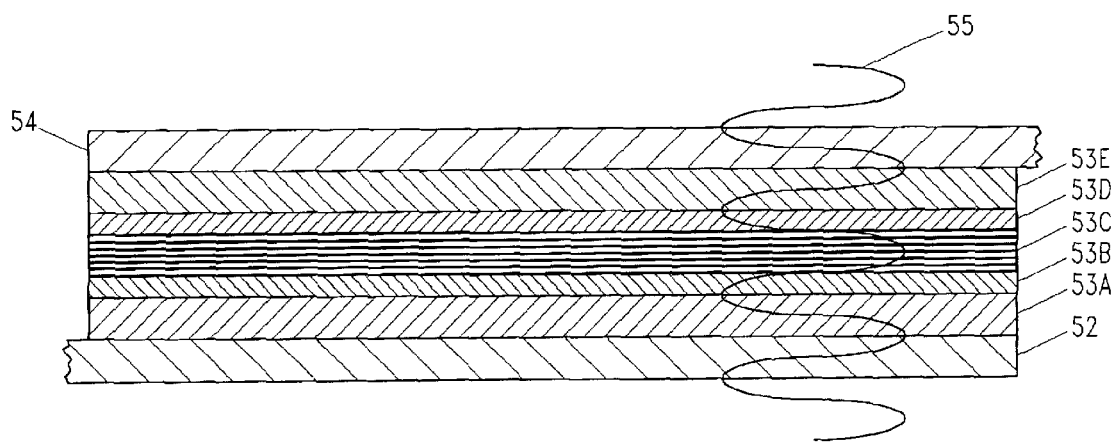
FIG. 19 shows a close-up side-view drawing of a vertical-section of a typical double-heterostructure active-region, which is shown as additional embodiment, while displaying the two primary un-graded confinement cladding-layers, the two secondary confinement heterostructure cladding-layers, and the active-area comprising multiple quantum-well layers and multiple quantum well cladding-layers.

An alternative embodiment to the present FCSSL invention as illustrated in FIG. 19 shows an alternative embodiment to the double-heterostructure light emitting diode design previously described in the preferred embodiment.

Moreover, the alternative embodiment, as illustrated in FIG. 19 is shown to be a double-heterostructure diode design, but is alternatively configured as an active-region 53 (FIG. 19) that comprises a (MQW) "Multiple Quantum Well" active-area 53C (FIG. 19), two primary contra-positioned non-graded confinement cladding-layers 53A, 53E (FIG. 19), two contra-positioned non-graded (SCH) "Separate Confinement Heterostructure" cladding-layers 53B, 53D (FIG. 19), one positive contact-layer 54 (FIG. 19), and one negative contact-layer and crystal growing substrate 52 (FIG. 19).

Furthermore, the alternative embodiment to the present FCSSL invention as illustrated in FIG. 19 shows a double-heterostructure light emitting diode design whose order of layered deposition begins with the creation of a first "200" nanometers thick contact-layer 52 (FIG. 19), which is formed from a pre-manufactured and pre-sliced semiconductor wafer that was comprised from a seed crystal of highly +n-doped (GaAs) "Gallium-Arsenide" binary material having a crystallographic orientation of <100>, <111>, <110>, or <001>, which is later ultimately used as the main substrate for the subsequent growth of crystalline semiconductor layers that will make-up the diode's main electrical electron conducting structure. An alternative FCSSL diode's first contact-layer 52 (FIG. 19), while providing negative electrical connectivity to the alternative FCSSL diode's light emitting active-region 53 (FIG. 19), will also enhance the reliability of the alternative FCSSL diode's design, by preventing the migration of carrier-dislocations, and the like, to the alternative FCSSL diode's active-area 53C (FIG. 19).

In addition, the alternative embodiment of the present FCSSL invention as illustrated in FIG. 19 shows a first "200" nanometers thick primary non-graded confinement cladding-layer 53A (FIG. 19), which is deposited, using MBE or MOCVD, onto the top and outermost surface of the alternative FCSSL diode's first contact-layer 52, giving it a deposited position between the alternative FCSSL diode's first contact-layer 52 and the alternative FCSSL diode's first non-graded SCH cladding-layer 53B (FIG. 19). The alternative embodiment of the present FCSSL invention as illustrated in FIG. 19 shows that the first "200" nanometers thick primary non-graded confinement cladding-layer 53A (FIG. 19) is comprised from an N-doped (AlGaAs) "Aluminum-Gallium-Arsenide" ternary semiconductor material.

In addition, the alternative embodiment to the present FCSSL invention as illustrated in FIG. 19 shows a first "100" nanometers thick non-graded SCH cladding-layer 53B (FIG. 19) comprised from a n-doped (GaAlAs) "Gallium-Aluminum-Arsenide" ternary semiconductor material, which is deposited, using MBE or MOCVD, onto the top and outermost surface of the alternative FCSSL diode's first primary non-graded confinement cladding-layer 53A (FIG. 19), giving it a deposited position between the alternative FCSSL diode's first primary non-graded confinement cladding-layer 53A and the alternative FCSSL diode's active-area 53C (FIG. 19). An alternative FCSSL diode's first "100" nanometers thick non-graded SCH cladding-layer 53B is comprised from a material having an refractive index that is between the refractive index of the multiple quantum wells that will make-up the alternative FCSSL diode's active-area 53C and the refractive index of the material that is used to construct the alternative FCSSL diode's first primary non-graded confinement cladding layers 53A (FIG. 19).

In addition, the alternative embodiment of the present FCSSL invention, as illustrated in FIG. 19, shows that next in line for material deposition is a active-area 53C (FIG. 19), which constitutes the FCSSL's active medium, which, through a process of stimulated emission, will produce additional light when the previously mentioned active medium is optically pumped by the intracavity confined light created by the population inversion that occurs within the alternative FCSSL diode's active-area 53C (FIG. 19), which is comprised as a MQW 53C (FIG. 19) structure that is located within the alternative FCSSL diode's active-region.

In addition, the alternative embodiment of the present FCSSL invention as illustrated in FIG. 19 shows that the previously mentioned active-area 53C is comprised as a multi-layered MQW structure 53C (FIG. 19), which is positioned between the alternative FCSSL's first and second non-graded SCH confinement cladding-layers 53B, 53D (FIG. 19) and comprises seven quantum well layers 50A, 50B, 50C, 50D, 50E, 50F, 50G (FIG. 18B) constructed from a binary (GaAs) "Gallium-Arsenide" semiconductor material having a small forbidden band width, and six quantum well cladding-layers 51A, 51B, 51C, 51D, 51E, 51F (FIG. 18B) constructed from a ternary (GaAlAs) "Gallium-Aluminum-Arsenide" semiconductor material having a very large forbidden band width. All thirteen of the previously mentioned semiconductor layers that make up an alternative FCSSL's active-area 53C (FIG. 19), when combined, form a single MQW having a combined material thickness that is one-quarter of one wavelength of the fundamental light emission created by the alternative FCSSL's active-region 53 (FIG. 19). For example, if an alternative FCSSL's active-region 53 (FIG. 19) were designed to create light with a fundamental wavelength of "800" nanometers, than the alternative FCSSL's active-area 53C would have a total material thickness one-quarter (i.e., "200" nanometers) of one wavelength of the fundamental "800" nanometer light created by the alternative FCSSL's active-region 53.

Figure 18A:
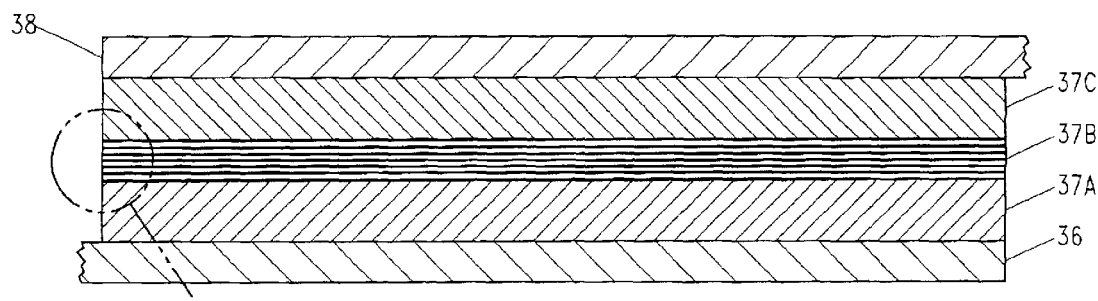
FIG. 18A shows a close-up side-view drawing of a vertical-section of a FCSSL's active-region, which displays the active-region's two contact-layers, two gradually graded cladding-layers, and an active-area comprising a multiple quantum-well.
Figure 18B:
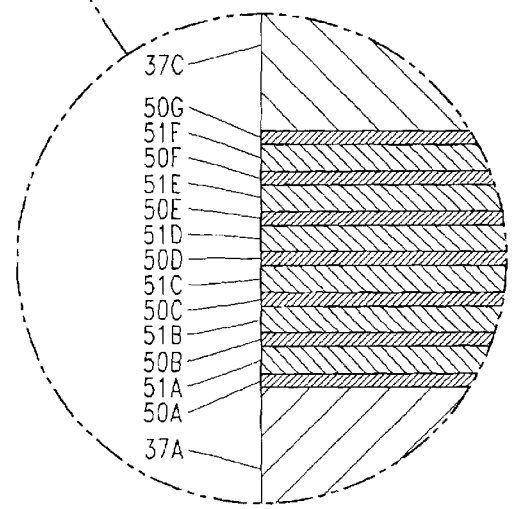
FIG. 18B shows an auxiliary close-up side-view drawing of a vertical-section of the active-region's active-area, which displays, along the active-region's outer-edge, details of the active-region's active-area.

Furthermore, if an alternative FCSSL's active-area 53C (FIG. 19), as shown in FIG. 18B, had seven quantum wells 50A, 50B, 50C, 50D, 50E, 50F, 50G comprised from binary (GaAs) "Gallium-Arsenide" semiconductor material, the before mentioned seven quantum well layers would each need to have a material thickness of about "10.30" nanometers. Additionally, if an alternative FCSSL's active-area 53C had six quantum well cladding-layers 51A, 51B, 51C, 51D, 51E, 51F (FIG. 18B) comprised from ternary (GaAlAs) "Gallium-Aluminum-Arsenide" semiconductor material the before mentioned six quantum well cladding-layers would each need to have a material thickness of about "21.30" nanometers. The thickness amounts for each of the seven quantum well layers and six quantum well cladding-layers located within the alternative FCSSL's active-area 53C, when combined, should have a total material thickness equaling "200" nanometers or one-quarter of one wavelength of the fundamental "800" nanometer light that is created by the alternative FCSSL's active-region 53 (FIG. 19).

In addition, the alternative embodiment of the present FCSSL invention has its general energy profile also diagrammatically characterized in FIG. 17. More specifically, FIG. 17 illustrates a profile of the potential wells and the discreet energy levels assumed by the carriers respectively in the conduction and valency bands (i.e., respectively electrons and holes). When, an epitaxy, semiconductor film having a small forbidden band e2 (e.g., a film with a typical thickness of about ten nanometers), such as films 50A, 50B, 50C, 50D, 50E, 50F, 50G (FIG. 18B), which are surrounded by two films having a larger forbidden band e0 (e.g., a film with a typical thickness of about twenty nanometers), such as films 51A, 51B, 51C, 51D, 51E, 51F (FIG. 18B), the previously mentioned electrons and holes of the small forbidden band material 50A, 50B, 50C, 50D, 50E, 50F, 50G (FIG. 18B) are confined in mono-directional potential wells e2.

Therefore, as illustrated in FIG. 17 the movement of an electron into a well created in the conduction band of height .DELTA.E.sub.c is quantified in discreet states of energy E.sub.1, E.sub.2, E.sub.3, etc.; moreover, in the same way, the movement of a hole into a well created in the valency band of height .DELTA.E.sub.x is quantified in discreet states of energy E'.sub.1, E'.sub.2, and E'.sub.3. When the thickness of the small forbidden bandwidth material e2 varies, the energy states assumed by the carriers also vary. Therefore, the emission length of the previously mentioned MQW structures can consequently be adjusted by the choice, the nature, and the thickness of the semiconductor material films used in their construction.

In addition, the alternative embodiment to the present FCSSL invention, as illustrated in FIG. 19, shows that next layer in line for deposition is a second "100" nanometers thick non-graded SCH cladding-layer 53D, which is comprised from a p-doped (GaAlAs) "Gallium-Aluminum-Arsenide" ternary semiconductor material that is deposited using MBE or MOCVD onto the top and outermost surface of the alternative FCSSL diode's active-area 53C (FIG. 19). Giving it a deposited position between the alternative FCSSL diode's active-area 53C and the alternative FCSSL diode's second primary non-graded confinement cladding-layer 53E (FIG. 19). An alternative FCSSL diode's second "100" nanometers thick non-graded SCH cladding-layer 53D is to be made from a material having an refractive index between the refractive index of the alternative FCSSL diode's multiple quantum wells and the refractive index of the material used to construct the alternative FCSSL diode's second primary non-graded confinement cladding layers 53E (FIG. 19).

In addition, the alternative embodiment to the present FCSSL invention as illustrated in FIG. 19 shows that the next layer in line for deposition is an alternative FCSSL diode's second "200" nanometers thick primary non-graded confinement cladding-layer 53E, which is epitaxially deposited using MBE or MOCVD onto the top and outermost surface of the alternative FCSSL diode's second "100" nanometers thick non-graded SCH cladding-layer 53D (FIG. 19). Giving it a deposited position between the alternative FCSSL diode's second "100" nanometers thick non-graded SCH cladding-layer 53D and the alternative FCSSL diode's second contact-layer 54 (FIG. 19). The alternative embodiment of the present FCSSL invention as illustrated in FIG. 19 shows that the second "200" nanometers thick primary non-graded confinement cladding-layer 53E (FIG. 19) is comprised from a P-doped (AlGaAs) "Aluminum-Gallium-Arsenide" ternary semiconductor material.

In addition, the alternative embodiment to the present FCSSL invention as illustrated in FIG. 19 shows the next layer in line for deposition is an alternative FCSSL diode's second "200" nanometers thick contact-layer 54, which is comprised from a highly +p-doped (GaAs) "Gallium-Arsenide" binary semiconductor material that is epitaxially deposited onto the top and outermost surface of the alternative FCSSL diode's second primary non-graded confinement cladding-layer 53E (FIG. 19). The alternative embodiment to the present FCSSL invention as illustrated in FIG. 19 shows that the second "200" nanometers thick contact-layer 54 (FIG. 19), while providing positive electrical connectivity to the alternative FCSSL diode's active-region 53 (FIG. 19), will also enhance the reliability of the alternative FCSSL diode's design by preventing the migration of carrier-dislocations, and the like, to the alternative FCSSL diode's active-area 53C (FIG. 19).

Furthermore, the alternative embodiment to the present FCSSL invention as illustrated in FIG. 19 shows a standing wave 55 (FIG. 19) plotted across the alternative embodiment double-heterostructure diode's structure. Wherein, the standing wave's 55 peak crest is centered onto the center of the alternative FCSSL diode's active-area 53C (FIG. 19), which illustrates how a standing-wave should propagate through a properly designed active-region. For example, an alternative FCSSL diode's active-region, as illustrated in FIG. 19, shows that when the diode device comprises two contra-propagating "100" nanometers thick non-graded SCH cladding-layers 53B, 53D and an active-area "200" nanometers thick 53C (FIG. 19) layers, moreover equaling a total material thickness of "400" nanometers or one-half of one wavelength of the fundamental "800" nanometer light generated by the alternative embodiment diode's active-region, would be centered on a propagating standing wave's crest; thus generating the optimal gain that will generate greater stimulated emissions of intra-cavity produced light.

Advantages

From the description above, a number of advantages of my present invention become evident:

(a) The total elimination, along with the manufacturing processes associated with their construction, of what is typically known in prior-art solid-state VCSEL diode laser design as quarterwave mirror-stack assemblies, or base located quarterwave mirror-stack reflectors, which are replaced as illustrated in FIGS. 7, 8, 9, 10, 11, 12, and 13 by the present inventions polyhedral prism waveguide 35, 44, 47 (FIGS. 14A, 14B, 15A, 15B, 16A, and 16B).

(b) The use of a polyhedral prism waveguide, which is located at the base of the present invention's vertical cavity, replaces the more conventional metallic alloy and/or sapphire substrates and/or the planar-flat multi-layered quarterwave mirror-stack assemblies 24 (FIGS. 1, 2, 3, and 4) normally used in prior-art solid-state VCSEL diode laser designs, with a single layered monolithic structure that will transmit any or all frequencies of optical radiation produced by the laser's diode.

(c) The polyhedral prism waveguides used in the present invention are monostructural (i.e., formed into a single shape from a single material) polyhedrons, which are geometrically complex, but structurally simply, as opposed to the quarterwave mirror-stacks used in prior-art solid-state VCSEL diode lasers, which are geometrically simple, but structurally complex, and comprised as multilayered structures having a multitude of thin-film planar-flat plates that are constructed from materials having alternate refractive indices.

(d) The present invention's monostructural polyhedral prism waveguides 35, 44, 47 (FIGS. 14A, 14B, 15A, 15B, 16A, and 16B), when constructed from ion doped solid-state active-medium materials like one of the following materials: YAG ($Y_3Al_5O_{12}$), LMA ($LaMgAl_{11}O_{19}$), $YVO_4$, YSO ($Y_2SiO_5$), YLF ($YLiF_4$), or $GdVO_4$ are inexpensive and easy to manufacture.

(e) The present invention's monostructural polyhedral prism waveguides 35, 44, 47 (FIGS. 14A, 14B, 15A, 15B, 16A, and 16B), when constructed from ion doped solid-state active-medium materials like one of the following materials: YAG ($Y_3Al_5O_{12}$), LMA ($LaMgAl_{11}O_{19}$), $YVO_4$, YSO ($Y_2SiO_5$), YLF ($YLiF_4$), or $GdVO_4$ are moisture resistant.

(f) The present invention's monostructural polyhedral prism waveguides 35, 44, 47 (FIGS. 14A, 14B, 15A, 15B, 16A, and 16B), when constructed from ion doped solid-state active-medium materials like one of the following materials: YAG ($Y_3Al_5O_{12}$), LMA ($LaMgAl_{11}O_{19}$), $YVO_4$, YSO ($Y_2SiO_5$), YLF ($YLiF_4$), or $GdVO_4$ are heat resistant.

(h) The present invention's monostructural polyhedral prism waveguides 35, 44, 47 (FIGS. 14A, 14B, 15A, 15B, 16A, and 16B), when constructed from ion doped solid-state active-medium materials like one of the following materials: YAG ($Y_3Al_5O_{12}$), LMA ($LaMgAl_{11}O_{19}$), $YVO_4$, YSO ($Y_2SiO_5$), YLF ($YLiF_4$), or $GdVO_4$ are non-conducting.

(j) The present invention's monostructural polyhedral prism waveguides 35, 44, 47 (FIGS. 14A, 14B, 15A, 15B, 16A, and 16B), when constructed from ion doped solid-state active-medium materials like one of the following materials: YAG ($Y_3Al_5O_{12}$), LMA ($LaMgAl_{11}O_{19}$), $YVO_4$, YSO ($Y_2SiO_5$), YLF ($YLiF_4$), or $GdVO_4$ are non-polarizing to intra-cavity produced light.

(k) The present invention's monostructural polyhedral prism waveguides 35, 44, 47 (FIGS. 14A, 14B, 15A, 15B, 16A, and 16B), when constructed from ion doped solid-state active-medium materials like one of the following materials: YAG ($Y_3Al_5O_{12}$), LMA ($LaMgAl_{11}O_{19}$), $YVO_4$, YSO ($Y_2SiO_5$), YLF ($YLiF_4$), or $GdVO_4$ are amorphous (i.e., a material made up of molecules that lack a distinct crystalline structure) and, therefore have an absolute lattice-mismatch to typical diode constructing semiconductor materials like (GaAs) "Gallium-Arsenide" and (AlGaAs) "Aluminum-Gallium-Arsenide, and to other Zinc-blend semiconductor materials, as well. This tends to promote greater reflectivity at the material interface located between the FCSSL's first contact layer 36 (FIGS. 9 and 10) and the FCSSL's polyhedral prism waveguide.

(l) The present invention's monostructural polyhedral prism waveguides 35, 44, 47 (FIGS. 14A, 14B, 15A, 15B, 16A, and 16B), when constructed from ion doped solid-state active-medium materials like one of the following materials: YAG ($Y_3Al_5O_{12}$), LMA ($LaMgAl_{11}O_{19}$), $YVO_4$, YSO ($Y_2SiO_5$), YLF ($YLiF_4$), or $GdVO_4$ are optically transparent to optical radiation having wavelengths ranging from the very-short "150" nanometers of ultraviolet radiation to the very-long "5000" nanometers of infrared radiation.

(m) The present invention's monostructural polyhedral prism waveguides 35, 44, 47 (FIGS. 14A, 14B, 15A, 15B, 16A, and 16B), when constructed from ion doped solid-state active-medium materials like one of the following materials: YAG ($Y_3Al_5O_{12}$), LMA ($LaMgAl_{11}O_{19}$), $YVO_4$, YSO ($Y_2SiO_5$), YLF ($YLiF_4$), or $GdVO_4$ will, depending upon the choice of material, will optically pump radiation having wavelengths ranging from the very-short "150" nanometers of ultraviolet radiation to the very-long "5000" nanometers of infrared radiation.

(n) The present invention's monostructural polyhedral prism waveguides 35, 44, 47 (FIGS. 14A, 14B, 15A, 15B, 16A, and 16B), when constructed from ion doped solid-state active-medium materials like one of the following materials: YAG ($Y_3Al_5O_{12}$), LMA ($LaMgAl_{11}O_{19}$), $YVO_4$, YSO ($Y_2SiO_5$), YLF ($YLiF_4$), or $GdVO_4$ are totally and internally reflecting to optical radiation having wavelengths ranging from the very-short "150" nanometers of ultraviolet radiation to the very-long "5000" nanometers of infrared radiation.

(o) The present invention's monostructural polyhedral prism waveguides 34, 42, 45 (FIGS. 18A, 18B, 19A, 19B, 20A, and 20B) by having a monostructural geometry they have the ability to internally redirect a "180" degrees all optical radiation that enters their plane-parallel, flat-horizontal, and circular top front-face surface 35D (FIGS. 14A and 14B), 44C (FIGS. 15A and 15B), 47B (FIGS. 16A and 16B).

(p) The present invention's monostructural polyhedral prism waveguides 34, 42, 45 (FIGS. 18A, 18B, 19A, 19B, 20A, and 20B) also will increase the present invention's modal-discrimination by extending its optical-cavity length.

Operation—FIGS. 7, 8, 9, 10, 11, 12, 18A, 18B, and 19

In general terms, a microlaser according to the present invention has a solid-state active-medium located within a folded cavity, which is defined by single output/input mirror and internal light reflecting prism facets that comprise a polyhedral shaped waveguide structure constructed using an ion implanted material. The solid-state active-medium material used in the construction of the FCSSL's polyhedral shaped prism waveguides essentially consist of a base material doped with active laser ions. The base material will either have a crystalline or an amorphous form depending upon its chosen deposition, and is typically chosen from one of the following materials: YAG ($Y_3Al_5O_{12}$), LMA ($LaMgAl_{11}O_{19}$), $YVO_4$, YSO ($Y_2SiO_5$), YLF ($YLiF_4$), or $GdVO_4$, etc.

In addition, the choice criteria for one or other of these materials are given in EP-653 824 (U.S. Pat. No. 5,495,494). This document also gives information on the choice of the thickness of the active-medium, particularly for obtaining a monomode laser, typically, the thickness of the active-medium is approximately: "750" micrometers for a YAG active-medium, "500" micrometers for an $YVO_4$ active-medium, "150" micrometers for a LMA active-medium. Concerning the doping ions, a choice is generally made of neodymium (Nd) for a laser emission around "1.06" micrometers. It is also possible to choose Erbium (Er) or an Erbium-Ytterbium codoping (Er+Yb) for an emission of around "1.5" micrometers. For an emission around "2" micrometers a choice is made of Thulium (Tm), or Holmium (Ho), or a Thulium-Holmium codoping. Doping with Ytterbium makes it possible to obtain an emission at "1.03" micrometers. It is also possible to produce an active-medium constituted by glass, e.g. doped with Erbium and Ytterbium (i.e., emission at "1.55" micrometers), as explained in the article by P. Thony et al. entitled "1.55 micrometers wavelength CW microchip laser", Proceedings of Advanced Solid-State Laser 1996, San Francisco, where the doped glass active-medium is consequently dielectric.

Another element can also be present within the FCSSL's cavity according to the present invention, i.e. a saturable absorber element. In a particularly advantageous manner, the saturable absorber can be a saturable absorber thin film material directly deposited on the solid-state active-medium. If the latter has a crystalline structure, an interesting process for the production of a saturable absorber thin film is liquid phase epitaxy. In this case, the thin film is constituted by a base material, identical to that of the solid-state active-medium, and doped with ions, giving it saturable absorber properties, e.g. Chromium ($Cr^{4+}$) or Erbium ($Er^{3+}$) ions. It is therefore possible to obtain a saturable absorber thin film directly deposited onto the active-medium and with a thickness between a few micrometers and approximately "400" micrometers. All the information necessary for producing such a saturable absorber thin film is given in EP-653 824 (U.S. Pat. No. 5,495,494).

In addition, other types of optical elements can also be provided within the FCSSL's cavity, e.g. a non-linear frequency doubler or tripler crystal, or an optical parametric oscillator. No matter whether the FCSSL cavity incorporates a saturable absorber, or an active cavity switching means, or an optically non-linear element (i.e., frequency doubler, tripler, OPO), the beam from the FCSSL folded cavity according to the present invention still benefits from advantageous properties associated with being optically pumped by a "Folded Cavity Surface Emitting Laser" (FCSEL), which uses a multiple quantum well structure as its primary active-region.

Moreover, such primary active-regions typically comprise a periodic arrangement of layers or films of a semiconductor material having a very wide forbidden band (e.g., GaAlAs) and layers or films of a semiconductor material having a small forbidden band width (e.g., GaAs). Such structures can be obtained by vapor phase epitaxy from organometallic compounds, e.g. MOCVD (i.e., organometallic chemical vapor phase deposition), or by molecular beam epitaxy. Using such epitaxial deposition methods, it is possible to adjust the deposit and thickness of semiconductor films with an accuracy of the same order of magnitude as the interatomic distance. Thus, the thickness $e_0$ of film 30 and the thickness $e_2$ of film 32 can be adjusted very precisely.

In addition, the alternative embodiment of the present FCSSL invention has its general energy profile also diagrammatically characterized in FIG. 17. More specifically, FIG. 17 illustrates a profile of the potential wells and the discreet energy levels assumed by the carriers respectively in the conduction and valency bands (i.e., respectively electrons and holes). When, an epitaxy, semiconductor film having a small forbidden band e2 (e.g., a film with a typical thickness of about ten nanometers), such as films 50A, 50B, 50C, 50D, 50E, 50F, 50G (FIG. 18B), which are surrounded by two films having a larger forbidden band e0 (e.g., a film with a typical thickness of about twenty nanometers), such as films 51A, 51B, 51C, 51D, 51E, 51F (FIG. 18B), the previously mentioned electrons and holes of the small forbidden band material 50A, 50B, 50C, 50D, 50E, 50F, 50G (FIG. 18B) are confined in monodirectional potential wells e2.

Therefore, as illustrated in FIG. 17 the movement of an electron into a well created in the conduction band of height $\Delta E_c$ is quantified in discreet states of energy $E_1$, $E_2$, $E_3$, etc.; moreover, in the same way, the movement of a hole into a well created in the valency band of height $\Delta E_x$ is quantified in discreet states of energy $E'_1$, $E'_2$, and $E'_3$. When the thickness of the small forbidden bandwidth material e2 varies, the energy states assumed by the carriers also vary. Therefore, the emission length of the previously mentioned MQW structures can consequently be adjusted by the choice, the nature, and the thickness of the semi-conductor material films used in their construction.

In addition, a "Folded Cavity Solid-State Laser" (FCSSL) constitutes an active-medium in addition to its active-region's active-area. This active-medium comprises a FCSSL's polyhedral shaped prism waveguide, which is constructed using an ion doped solid-state active-medium material like one of the following materials: YAG ($Y_3Al_5O_{12}$), LMA ($LaMgAl_{11}O_{19}$), $YVO_4$, YSO ($Y_2SiO_5$), YLF ($YLiF_4$), or $GdVO_4$, etc.

Moreover, concerning the doping ions, a choice is generally made of neodymium (Nd) for a laser emission around "1.06" micrometers. It is also possible to choose Erbium (Er) or an Erbium-Ytterbium codoping (Er+Yb) for an emission of around "1.5" micrometers. For an emission around "2" micrometers a choice is made of Thulium (Tm), or Holmium (Ho), or a Thulium-Holmium codoping. Doping with Ytterbium makes it possible to obtain an emission at "1.03" micrometers. A monolithic mirror structure needed for a successful construction of a FCSSL can be produced at wavelength $\lambda$. by epitaxially depositing a stack of films i and j using materials having high and low refractive optical indices $n_{ij}$ of thickness $(\lambda/4)n_{ij}$.

Therefore, these semiconductor thin films can be produced by using a well known method of material deposition like MOCVD or MBE to epitaxially deposit the semiconductor material in question, whereof during deposition the composition and thickness of a semiconductor or optical material layer would be strictly controlled. This way the reflectivity of a FCSSL's quarterwave mirror-stack assembly can be adjusted as a function of the FCSSL's emission wavelength. The FCSSL is electrically pumped with the aid of two electrodes connected on either side of the FCSSL's double-heterostructure light emitting diode active-region 36, 38. There are relative possibilities with regard to the present invention's choice of light emitting active-regions, one of which is the FCSSL's novel approach to a double-heterostructure semiconductor LED design 36 (FIGS. 9 and 10), which is based upon a structural enhancement of its cladding-layer design, which can effectively increase the amount of recombined "electron/hole" radiation, or what is generally called "radiative recombination" that occurs within the FCSSL's active-region 37B (FIGS. 9 and 10).

Furthermore, the present FCSSL invention, as illustrated in FIGS. 9 and 10, effectively displays a sectional view of the FCSSL's many different layers of semiconductor and optical materials that are used in the FCSSL's construction. Moreover, the previously mentioned layers that are used to construct a FCSSL's double-heterostructure LED active-region, a FCSSL's polyhedral prism waveguide, and a FCSSL's quarterwave mirror-stack assembly, are built-up, layer upon layer, using various epitaxial and ion sputtered material deposition processes. For example, the layers of optical and semiconductor materials that make up a FCSSL device can be constructed by using widely excepted methods of material deposition like MBE, MOCVD, and/or Ion Sputtering.

The present FCSSL invention, as illustrated in FIGS. 7, 8, 9, and 10 is an index-guided semiconductor surface emitting folded cavity laser that has totally eliminated substrate positioned multilayered quarterwave mirror-stack base-reflector assemblies typical of prior-art solid-state VCSEL diode laser design 24 (FIG. 3), and replaced it with a single layered polyhedral shaped waveguide structure 35 (FIG. 14), 44 (FIG. 15), 47 (FIG. 16). However, regardless of any changes that might be made to a semiconductor laser's optical cavity, light amplifying processes via stimulated-emission can only occur within any semiconductor laser if fundamental light-waves produced by the laser's diode 28 (FIG. 3), 37 (FIG. 9) are made to oscillate between two light reflecting structures 24, 32 (FIG. 3) 35, 39 (FIG. 9) that are contra-positioned at both ends of an optical cavity's active-region 28 (FIG. 3), 37 (FIG. 9).

Moreover, the present FCSSL invention, as illustrated in FIGS. 7, 8, 9, and 10 amplifies light via stimulated-emission when light-waves produced by its active-region 36 (FIG. 9) are made to oscillate through the previously mentioned light reflecting structures 35, 39. Consequently, as the previously mentioned oscillations occur light-waves will pass through the previously mentioned optical cavity's active-region 37 (FIG. 9) and the multiple quantum well structures that make-up the active-region's active-area 37B (FIG. 9). However, in the present FCSSL invention the previously mentioned light-wave oscillations do not occur between two different contra-reflecting mirror structures located at opposite ends of an optical cavity's active-region 24, 32 as illustrated in FIGS. 1, 2, and 3, but occur only between a single light reflecting structure 39 (FIG. 9), which is located at only one end of an optical cavity's active-region 37 (FIG. 9).

For example, the present FCSSL invention, by replacing a substrate 22 (FIG. 3) positioned and total reflecting quarterwave mirror-stack assembly 24 (FIG. 3) with a single total internal reflecting polyhedral prism waveguide 34 (FIG. 9), the optical cavity of the FCSSL is folded backwards a "180" degrees upon itself, where light-waves of fundamental light created by the FCSSL's active-region 36 (FIG. 9) are made to oscillate, using a folded optical cavity, back and forth, through the active-region's active-area 36B (FIG. 9), between a single partial light reflecting structure 38 (FIG. 9). The oscillating lightwaves that occur within a FCSSL's folded optical cavity, while propagating through the FCSSL's polyhedral shaped prism waveguide 35 (FIG. 9), will have angles of incidence that are equal to or greater than the critical angle of internal reflection for the polyhedral prism waveguide's prism facets 35A, 35B, 35C, which are located at the base of every FCSSL polyhedral prism waveguide 35 (FIG. 14), 44 (FIG. 15), 47 (FIG. 16).

Moreover, oscillating light-waves 42A (FIG. 14) that propagate 42B in a direction away from the FCSSL's active-region 37 (FIG. 9) into the FCSSL's polyhedral prism waveguide 35 (FIG. 9) are ultimately turned and redirected by a prism facet 35A (FIG. 9) of the polyhedral prism waveguide 35 (FIG. 9) into a transverse horizontal direction 42C (FIG. 14) until they are turned and redirected again by a second prism facet 35B (FIG. 14), and a third prism facet 35C (FIG. 14) of the polyhedral prism waveguide 35, but into a longitudinal vertical direction 42E (FIG. 14) toward the FCSSL's active-region 37 (FIG. 9); wherein, oscillating light-waves 42F (FIG. 14) propagating toward the FCSSL's single light reflecting structure 39 (FIG. 9) will stimulate further emission of light as they pass through the active-region's active-area 37B (FIG. 9) and the polyhedral prism waveguide 35 itself being constructed from an ion containing laser-active material, until they reach the FCSSL's single light reflecting structure 39, where they 42F will be made to start a new oscillation cycle. This process moreover creates an optical cavity that is folded backwards onto itself and, which is capable, during light-wave oscillation, of the amplification of fundamental diode produced light via the process of stimulated-emission.

Furthermore, a FCSSL's polyhedral prism waveguide 35, 45, 47, as illustrated in FIGS. 7, 8, 9, 10, 11, and 12 are constructed as monolithic polyhedral shaped devices that are conducive to the total internal reflection of intracavity produced optical radiation using an optical material having an absolute lattice mismatch to other semiconductor materials used in the construction of the FCSSL's remaining semiconductor layers. Therefore, within the FCSSL design, an internal reflecting polyhedral prism waveguide 35, 44, 47 which redirects all optical radiation entering its top plane-parallel and flat horizontal front-face surface 35D, 44C, 47B backwards toward the FCSSL's partially reflecting quarter-wave mirror-stack assembly 39 (FIG. 9) is used.

Moreover, a FCSSL's polyhedral prism waveguide 35, 44, 47, as illustrated in FIGS. 7, 8, 9, 10, 11, and 12, while constructed using an ion doped solid-state active-medium material like one of the following materials: YAG ($Y_3Al_5O_{12}$), LMA ($LaMgAl_{11}O_{19}$), $YVO_4$, YSO ($Y_2SiO_5$), YLF ($YLiF_4$), or $GdVO_4$, etc., will allow the FCSSL's polyhedral prism waveguide to internally redirect and transmit all optical radiation incidental to its top plane-parallel and flat horizontal front-face surface. Depending upon the ion containing material used to construct a FCSSL's polyhedral prism waveguide 35, 44, 47 it will have the capability of transmitting all optical radiation having wavelengths that range from the ultraviolet (i.e., having a wavelength of "105" nanometers) to the far infrared (i.e., having a wavelength of "10,000" nanometers).

Moreover, extracting light from an LED for amplification is not easy because of the high index of refraction of the semiconductor material, which may be in the range of from about 2.9 to 4.0, depending on wavelength and material. According to Snell's law sin.theta..sub.c=n.sub.s/n.sub.p only rays that impinge on the FCSSL's polyhedral prism waveguide's prism facets at an angle equal to or less than theta..sub.c will be refracted through the surface. All rays impinging at angles greater than .theta..sub.c will experience total internal reflection.

Conclusion, Ramifications, and Scope

Although the FCSSL invention has been described in detail with references to specific embodiments, various modifications can be made without departing from the scope of the invention.

For example, in order to increase the energy, while decreasing the wavelength per photon of emitted light, the active-region 37 (FIG. 9) could contain "Phosphorus" in an amount that will form a lattice-matched, quaternary, (InGaAsP) "Indium-Gallium-Arsenic-Phosphide" material, while another option could be that a FCSEL's quarterwave mirror-stack assembly 39 (FIG. 9) could be comprised of alternating layers of binary (AlAs) "Aluminum-Arsenide", and ternary (InGaP) "Indium-Gallium-Phosphide" materials, where the choice between one semiconductor or optical material over another for constructing the quarter-wave mirror-stack assembly 39 (FIG. 10) of a FCSEL is frequency determined, rather than structurally determined.

Furthermore, the various semiconductor and optical materials, along with their distribution sizes are frequency specific and interchangeable within this design; indicating that the FCSEL design has novelty that is independent of any one kind of material or any one kind of material size that could or might be used in its construction.

What is claimed is:

1. A folded cavity solid-state laser, comprising:

a cavity folding waveguide constructed from an ion implanted laser-active material that stimulates photonic radiation, wherein the cavity folding waveguide includes at least one prism facet for reflecting photonic radiation incident upon the cavity folding waveguide 180 degrees;

a semiconductor active-region adjacent to the cavity folding waveguide for producing spontaneous-emission of said photonic-radiation;

a photon reflecting dichroic-mirror adjacent to the semiconductor active region such that the semiconductor active-region is between the cavity folding waveguide and the photon reflecting dichroic-mirror, wherein the dichroic-mirror.

2. The folded cavity solid-state laser of claim 1, wherein the cavity folding waveguide includes an ion implanted laser-active material selected from the group consisting of YAG, LMA, $YVO_4$, YSO, YLF and $GDVO_4$.

3. The folded cavity solid-state laser of claim 1, wherein the cavity folding waveguide includes a corner cube polyhedral prism waveguide.

4. The folded cavity solid-state laser of claim 3, wherein the corner cube polyhedral prism waveguide includes at least two prism facets.

5. The folded cavity solid-state laser of claim 4, wherein the corner cube polyhedral prism waveguide includes three prism facets.

6. The folded cavity solid-state laser of claim 1, wherein the cavity folding waveguide includes a conical face.

7. The folded cavity solid-state laser of claim 1, wherein the semiconductor active region includes:

a first graded confinement layer adjacent to the cavity folding waveguide;

an active area; and a second graded confinement layer, wherein the second graded confinement layer is adjacent the dichroic-mirror such that the active area is between the first and second graded confinement layers.

8. The folded cavity solid-state laser of claim 7, wherein the active area includes a multi-quantum well.

9. The folded cavity solid-state laser of claim 8, wherein:

the first graded confinement layer includes an upper surface and a lower surface, wherein the upper surface is adjacent the active area and the lower surface is adjacent the cavity folding waveguide, and wherein the first graded confinement layer includes Gallium-Aluminum-Arsenide, wherein the concentration of Gallium increases from the lower surface to the upper surface and the concentration of Aluminum decreases from the lower surface to the upper surface; and the second graded confinement layer includes an upper surface and a lower surface, wherein the upper surface is adjacent the dichroic mirror and the lower surface is adjacent the active area, and wherein the second graded confinement layer includes Gallium-Aluminum-Arsenide, wherein the concentration of Gallium increases from the upper surface to the lower surface and the concentration of Aluminum decreases from the upper surface to the lower surface.

10. The folded cavity solid-state laser of claim 1, wherein the dichroic-mirror includes a quarter-wave mirror stack.

11. The folded cavity solid-state laser of claim 1, wherein the cavity folding waveguide is further for laterally shifting photonic radiation incident upon the cavity folding waveguide.

* * * * *